US008350328B2

(12) United States Patent
Ishigaki et al.

(10) Patent No.: US 8,350,328 B2
(45) Date of Patent: Jan. 8, 2013

(54) SEMICONDUCTOR DEVICE AND METHOD OF MANUFACTURING THE SAME

(75) Inventors: Takashi Ishigaki, Hino (JP); Ryuta Tsuchiya, Tokyo (JP); Yusuke Morita, Akishima (JP); Nobuyuki Sugii, Tokyo (JP)

(73) Assignee: Hitachi, Ltd., Tokyo (JP)

( * ) Notice: Subject to any disclaimer, the term of this patent is extended or adjusted under 35 U.S.C. 154(b) by 290 days.

(21) Appl. No.: 12/759,559

(22) Filed: Apr. 13, 2010

(65) Prior Publication Data
US 2010/0258871 A1    Oct. 14, 2010

(30) Foreign Application Priority Data
Apr. 14, 2009    (JP) .................................. 2009-98072

(51) Int. Cl.
*H01L 29/76* (2006.01)
(52) U.S. Cl. .................... 257/347; 257/401; 257/E29.52
(58) Field of Classification Search .................. 257/347, 257/401, E29.052
See application file for complete search history.

(56) References Cited

U.S. PATENT DOCUMENTS

| 6,953,726 | B2 * | 10/2005 | Nowak et al. | 438/268 |
| 7,355,253 | B2 | 4/2008 | Cohen | |
| 7,629,651 | B2 | 12/2009 | Nakajima | |
| 7,902,584 | B2 * | 3/2011 | Nakajima | 257/308 |
| 7,910,988 | B2 * | 3/2011 | Taketani | 257/330 |

OTHER PUBLICATIONS

Y. X. Liu et al.. "Flexible Threshold Voltage FinFETs with Independent Double Gates and an Ideal Rectangular Cross-Section Si-Fin Channel", IEDM Technical Digest (2003), pp. 986 to 988.

* cited by examiner

*Primary Examiner* — Minh-Loan T Tran
(74) *Attorney, Agent, or Firm* — Miles and Stockbridge P.C.

(57) ABSTRACT

Characteristics of a semiconductor device having a FINFET are improved. The FINFET has: a channel layer arranged in an arch shape on a semiconductor substrate and formed of monocrystalline silicon; a front gate electrode formed on a part of an outside of the channel layer through a front gate insulating film; and a back gate electrode formed so as to be buried inside the channel layer through a back gate insulating film. The back gate electrode arranged inside the arch shape is arranged so as to pass through the front gate electrode.

15 Claims, 35 Drawing Sheets

SEMICONDUCTOR DEVICE AND METHOD OF MANUFACTURING THE SAME

CROSS-REFERENCE TO RELATED APPLICATION

The present application claims priority from Japanese Patent Application No. JP 2009-098072 filed on Apr. 14, 2009, the content of which is hereby incorporated by reference into this application.

TECHNICAL FIELD OF THE INVENTION

The present invention relates to a semiconductor device and a method of manufacturing the same. More particularly, the present invention relates to a technique effectively applied to a semiconductor device having a FIN-type electric-field effect transistor (FET, simply called FINFET hereinafter) with a fin (FIN) shaped channel layer.

BACKGROUND OF THE INVENTION

As achieving a high-integrated and high-performed LSI, miniaturization for a metal insulator semiconductor (MIS) type FET (hereinafter, simply called MISFET) has been advanced. Due to scaling down of a gate length by the miniaturization, so-called short-channel effect problem has significantly arisen in which a threshold voltage Vth is lowered. The short-channel effect is caused by influence of spread of depletion layers in source and drain regions of the MISFET to a channel region with a miniaturization of a channel length.

As a device structure capable of suppressing the short-channel effect, a FINFET has been paid attention in which a stripe-shaped (also referred to as fin-shaped) region (hereinafter, simply called fin) is formed on a silicon substrate, and a MISFET with a three-dimensional structure is formed in the region. In the FINFET, a fin inside is completely depleted by a potential applied to a gate electrode, and therefore, a good short-channel effect can be obtained.

For example, IEDM Technical Digest (2003), pp. 986 to 988 (Non-Patent Document 1) discloses a technique of controlling characteristics of the FINFET by a second gate (back gate) in which a potential in a channel region is electrically isolated from a first gate (front gate). In this manner, a different potential can be applied to the front and back gates provided on both side walls of the fin, respectively. And, a channel is formed on the one-side surface of the fin by the front gate, and a potential of the channel region is controlled by the back gate, so that a desired threshold voltage is obtained.

Also, for example, U.S. Pat. No. 7,629,651 (Patent Document 1) discloses a FIN-type FBC (floating body cell) memory arranged in array, which has front and back gates on side surfaces of a FIN-type semiconductor layer.

Further, for example, U.S. Pat. No. 7,355,253 (Patent Document 2) discloses a FinFET having first and second gates formed on side portions of a channel made of strained silicon.

SUMMARY OF THE INVENTION

In the FINFETs which are effective for suppressing the short-channel effect as described above, the following problems have been found out by studies of the inventors.

In a FINFET, it is difficult to design so-called multi Vth in which FETs having different threshold voltages from each other are arranged on the same substrate as performed in a bulk-MISFET. A reason for the difficulty is that an impurity concentration required for obtaining a desired threshold voltage is increased too much for a completely-depleted miniaturized fin. Also, a channel containing high-concentration impurity adversely causes decrease in mobility or increase in characteristic variation due to statistic fluctuation of the impurity. Further, shape fluctuation caused in a forming process of the miniaturized fin also becomes the cause of increase in characteristic variation.

In order to solve these problems, the inventors have studied a technique of properly controlling the characteristics by two gates as described above. However, for example, in a case of using one-side surface of the fin for a front gate and the other-side surface for a control back gate, only the side surface on the front-gate side is used for a channel. In this manner, it has been found out that, current amount in the case is reduced by half compared with that of a conventional FINFET not using the back gate and using the both-side surfaces for the channel, and therefore, high-speed performance of a device is significantly damaged. Also, it has been found out that the structure of providing two gates electrically isolated from each other on both-side surfaces of the miniaturized fin is not suitable for further miniaturization because of a viewpoint of securing a contact region or others.

From the studies by the inventors as described above, it has been found out that, in the FINFET having an effective structure for suppressing the short-channel effect, a desired technique is to improve deterioration of transistor characteristics such as a variation of the threshold voltage as keeping the structure suitable for the miniaturization. Accordingly, a preferred aim of the present invention is to provide a technique of improving characteristics of a semiconductor device having a FINFET.

The above and other preferred aims and novel characteristics of the present invention will be apparent from the description of the present specification and the accompanying drawings.

While a plurality of inventions are disclosed in the present application, outlines of the typical one of the inventions will be briefly described as follows.

In a semiconductor device having a FINFET formed on a semiconductor substrate, the FINFET has: a channel layer arranged in an arch shape on the semiconductor substrate and made of monocrystalline silicon; a first gate insulating film covering a part of an outside of the channel layer; a first gate electrode covering the channel layer through the first gate insulating film; a second gate insulating film covering an inside of the channel layer; and a second gate electrode buried inside the channel layer through the second gate insulating film. Here, the channel layer has an arch shape so as to have a sidewall portion arranged in a direction crossing a main surface of the semiconductor substrate and a crosspiece portion arranged in a direction along the main surface to connect between tops of two sidewall portions. Also, the second gate electrode arranged inside the arch shape is arranged so as to pass through the first gate electrode.

The effects obtained by the typical one of the plurality of inventions disclosed in the present application will be briefly described below.

That is, characteristics of a semiconductor device having a FINFET can be improved.

BRIEF DESCRIPTIONS OF THE DRAWINGS

DESCRIPTIONS OF THE PREFERRED EMBODIMENTS

Components having the same function are denoted by the same reference symbols throughout the drawings for describing the embodiment, and the repetitive description thereof will be omitted as much as possible. Hereinafter, embodiments of the present invention will be described in detail with reference to the accompanying drawings.

First Embodiment

Figure 1:
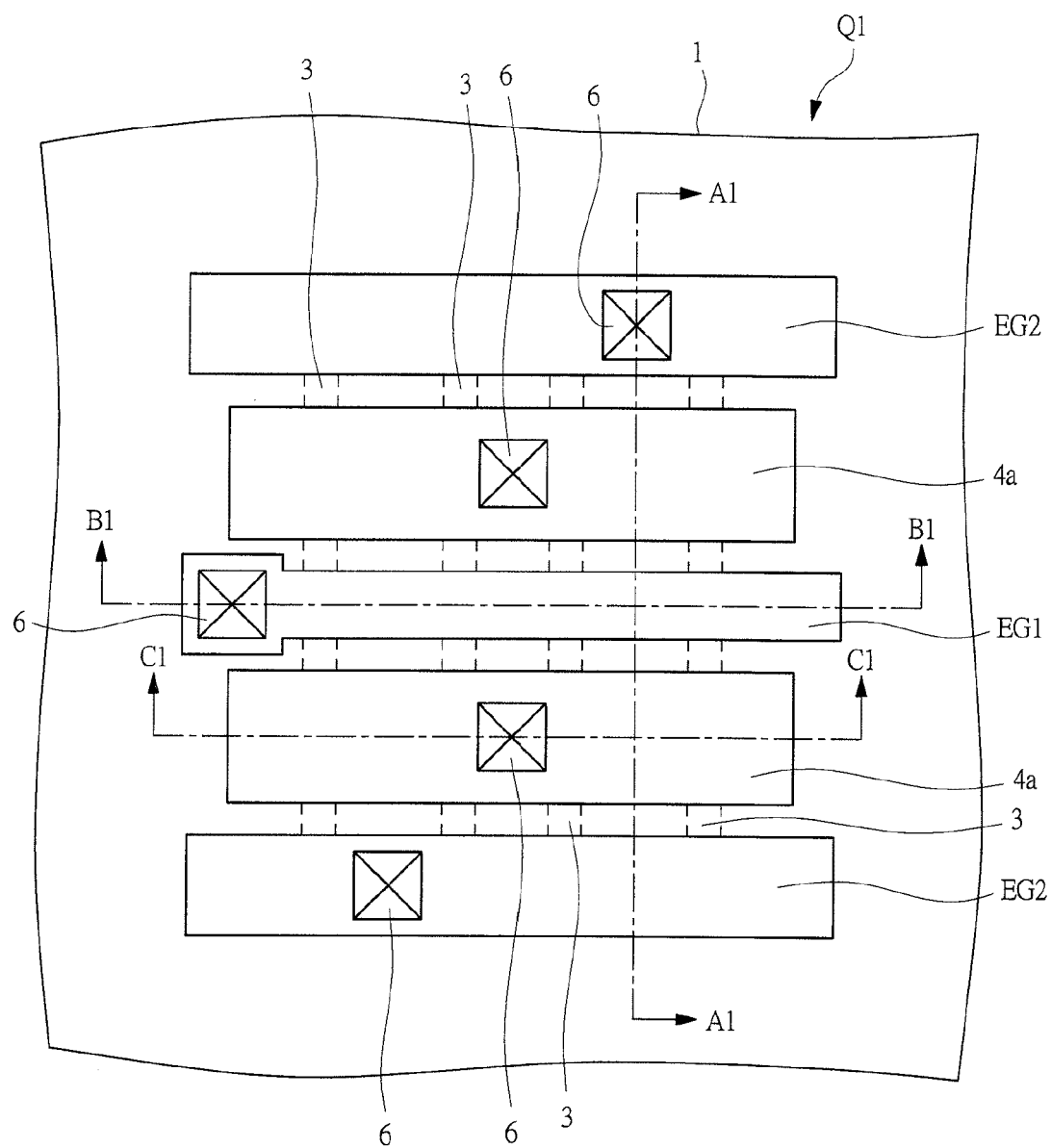
FIG. 1 is a plan view of a principal part of a semiconductor device according to a first embodiment of the present invention.
Figure 2:
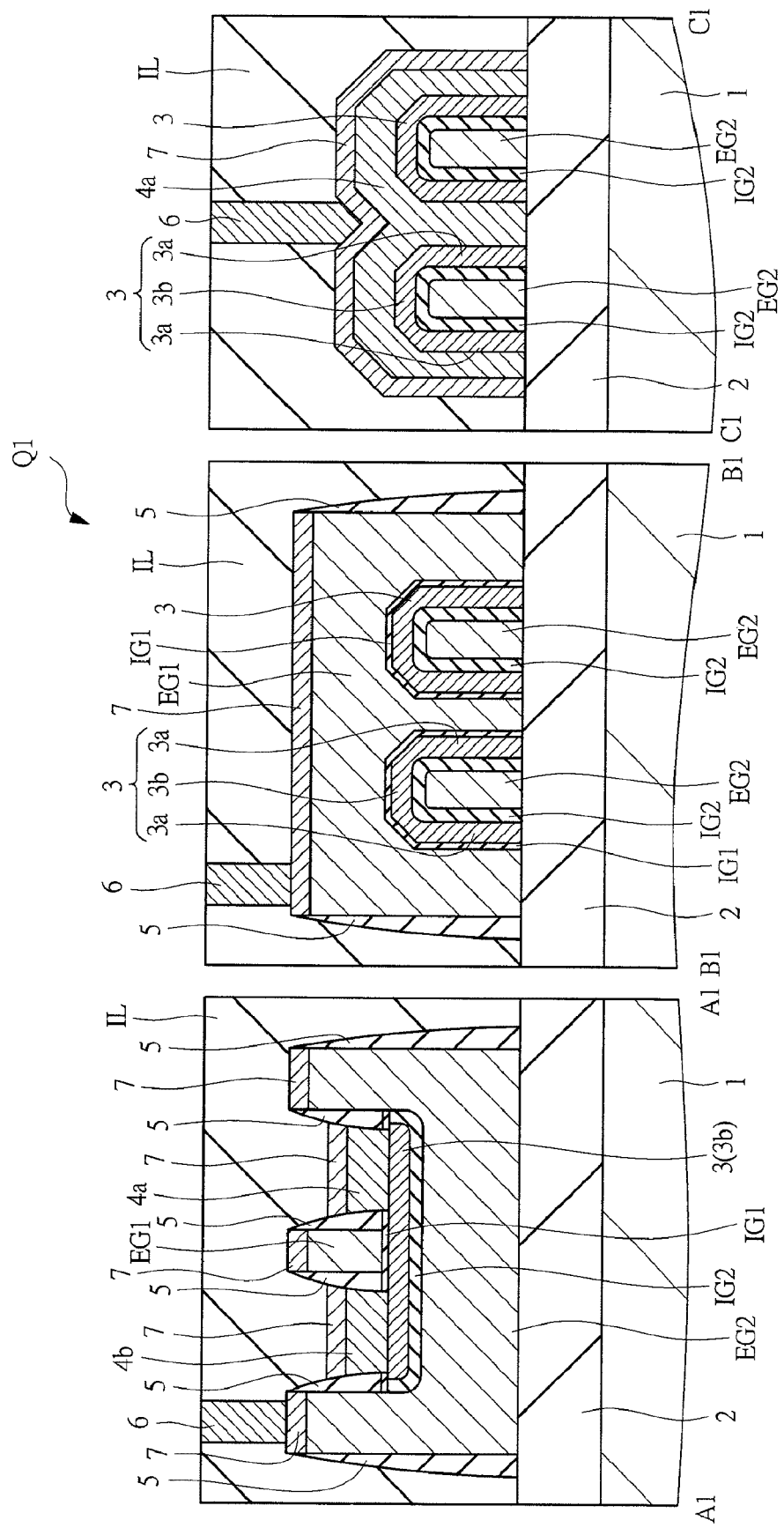
FIG. 2 is cross-sectional views of principal parts of the semiconductor device according to the first embodiment of the present invention which are viewed in each arrow direction along lines A1-A1, B1-B1, and C1-C1.

FIG. 1 illustrates a plan view of a principal part of a FIN-FET Q1 which a semiconductor device according to a first embodiment has. In FIG. 1, illustrations of a part of members such as an insulating film are omitted to easily see drawings. Also, FIG. 2 illustrates cross-sectional views of principal parts viewed in each arrow direction along lines A1-A1, B1-B1, and C1-C1 in the plan view of the principal part in FIG. 1. With reference to FIGS. 1 and 2, a structure of the FINFET Q1 according to the first embodiment will be described in detail. The FINFET Q1 which the semiconductor device according to the first embodiment has is formed on a silicon substrate (semiconductor substrate) 1, and has components described below.

On a main surface of the silicon substrate 1, an insulating layer 2 formed of an insulator mainly made of silicon oxide is formed. The FINFET Q1 according to the first embodiment is formed on the silicon substrate 1, more particularly, on the insulating layer 2. A thickness of the insulating layer 2 is, for example, about 200 nm.

On the insulating layer 2, a channel layer 3 formed of a semiconductor mainly made of monocrystalline silicon is formed. The channel layer 3 is arranged in the arch shape. The arch shape described here is, more specifically, a shape having: a channel sidewall portion (sidewall portion) 3a arranged in a direction crossing a main surface of the semiconductor substrate 1; and a channel crosspiece portion (crosspiece portion) 3b arranged in a direction along the main surface to connect between tops of two channel sidewall portions 3a. The channel layer of the FINFET Q1 according to the first embodiment has the arch shape formed by cutting out an inside of a fin shape as illustrated. The arch shape is also expressed as a reverse U shape.

Also, a thickness of the channel layer 3 is desirably one third a gate length (described later) of the FINFET Q1 or thinner. Further, in order to decrease the characteristic variation of the FINFET Q1, the impurity concentration becoming one cause of the variation is set to, for example, $1 \times 10^{17}$ cm$^{-3}$ or smaller.

In the FINFET Q1 according to the first embodiment, there are arranged two-type gate electrodes for providing electric-field effect to such an arch-shaped channel layer 3. Hereinafter, a front gate is a main gate for forming an inversion layer in a channel in a MIS structure to control a current value, and a back gate is a gate for adjusting characteristics of a transistor.

a front-gate structure as described below is formed outside the channel layer 3.

A front-gate insulating film (first-gate insulating film) IG1 is formed so as to cover a part of the outside of the channel layer 3. The front-gate insulating film IG1 is formed on the part of the outside of the channel layer 3 when the channel layer 3 is viewed in a longitudinal direction. And, in the part, the front-gate insulating film IG1 is formed from the channel sidewall portion 3a of the arch-shaped channel layer 3 over the channel crosspiece portion 3b of the same so as to integrally cover the outside of the channel layer 3.

The front-gate insulating film IG1 may be formed of an insulator made of a silicon oxide film, a stacked film of a silicon oxide film and a silicon nitride film, or others, and further, may be made of an insulator made of a high dielectric (High-k) film such as a hafnium oxide (HfO$_2$) film, an aluminum oxide (Al$_2$O$_3$) film, a zirconium oxide (ZrO$_2$) film, a hafnium silicon oxide (HfSiO) film, a hafnium silicon oxynitride (HfSiON) film, and a hafnium aluminum oxide (HfAlO) film, a stacked film of these high dielectric films deposited on a silicon oxide film, or others. In the FINFET Q1 according to the first embodiment, a stacked film of a silicon oxide film and a silicon nitride film, whose thickness is 10 nm or thinner, is used as the front-gate insulating film IG1.

Further, outside the channel layer 3, a front gate electrode (first-gate electrode) EG1 is formed so as to cover the channel layer 3 through the front-gate insulating film IG1. In the FINFET Q1 according to the first embodiment, when the main surface of the silicon substrate 1 is flatly viewed, the front gate electrode EG1 is formed so as to extend in a direction crossing an extending direction of the arch-shaped channel layer 3. Note that, in the example of the first embodiment, the front gate electrode EG1 is formed so as to pass over two channel layers 3. A gate length of the FINFET Q1 according to the first embodiment is a length of a portion viewed in the extending direction of the arch-shaped channel layer 3 in the portion where the front gate electrode EG1 contacts with the channel layer 3 through the front-gate insulating film IG1.

The front gate electrode EG1 may be formed of a conductor made of polysilicon (also called polycrystalline silicon) to which an impurity is doped, or a conductor made of a metal such as nickel (Ni), cobalt (Co), titanium (Ti), tungsten (W), tantalum (Ta), molybdenum (Mo), chromium (Cr), aluminum (Al), platinum (Pt), protactinium (Pa), and ruthenium (Ru), a metal silicide film, a metal nitride film, or a stacked film of a polysilicon film and these films or metals. Practically, a metal film having a desired work function required for electric characteristics is selected.

Also, inside the channel layer 3, a back-gate structure as described below is formed.

A back-gate insulating film (second-gate insulating film) IG2 is formed so as to cover the inside of the channel layer 3. The back-gate insulating film IG2 is formed from the channel sidewall portion 3a over the channel crosspiece portion 3b so as to integrally cover all over the inside of the channel layer 3. A material for the back-gate insulating film IG2 is the same as that of the above-described front-gate insulating film IG1. A thickness of the same will be described in detail later.

Further, inside the channel layer 3, a back gate electrode (second-gate electrode) EG2 is formed so as to be buried inside the channel layer 3. Here, when the channel layer 3 in which the back gate electrode EG2 is buried is flatly viewed, the channel layer 3 extends in a direction crossing the front gate electrode EG1. Therefore, when the main surface of the silicon substrate 1 is flatly viewed, the front gate electrode EG1 and the back gate electrode EG2 are arranged so as to cross each other. Effects obtained by arranging the front gate electrode EG1 and the back gate electrode EG2 so as to cross each other as described above will be described in detail later. A material for the back gate electrode EG2 is the same as that of the above-described front gate electrode EG1.

As described above, the FINFET Q1 according to the first embodiment has the structure in which the front gate electrode EG1 is provided on an upper portion and the back gate electrode EG2 is provided on a lower portion in taking the channel layer 3 as their boundary. In other words, the back gate electrode EG2 arranged inside the arch-shaped channel layer is arranged so as to pass through the front gate electrode EG1. Effects obtained by arranging the two-type gates in the arch-shaped channel layer 3 so as to have such a structure will be described in detail later.

Also, in the channel layer 3, a power feeing system as described below is formed.

a source layer 4a and a drain layer 4b are formed so as to cover the outside of the channel layer 3 so and contact with the channel layer 3. The source and drain layers 4a and 4b are formed on a part of the outside of the channel layer 3 when the channel layer 3 is viewed in a longitudinal direction. More particularly, the source and drain layers 4a and 4b are arranged on a part where the front-gate insulating film IG1 and the front gate electrode EG1 are not formed in the view in the longitudinal direction. And, the respective source and drain layers 4a and 4b are arranged on both sides of the front-gate insulating film IG1 and the front gate electrode EG1. In this part, the source and drain layers 4a and 4b are formed from the channel sidewall portion 3a of the arch-shaped channel layer 3 over the channel crosspiece portion 3b of the same so as to integrally cover the outside of the channel layer 3.

The source and drain layers 4a and 4b are formed of a semiconductor mainly made of monocrystalline silicon. Also, the source layer 4a and the front gate electrode EG1 arranged outside the channel layer 3 are insulated from each other, and the drain layer 4b and the front gate electrode EG1 arranged outside the channel layer 3 are insulated from each other. For example, a sidewall spacer 5 made of a silicon nitride film is arranged on a side wall of the front gate electrode EG1, so that they are insulated from each other.

Also, the source and drain layers 4a and 4b may be arranged so as to extend in the direction crossing the extending direction of the channel layer 3 similarly to the above-described front gate electrode EG1. In this manner, the source and drain layers 4a and 4b can be arranged so as to be connected with a plurality of channel layers. In the example of the first embodiment, the source and drain layers 4a and 4b are arranged so as to be connected with two channel layers 3.

Further, the FINFET Q1 has the structure in which the source and drain layers 4a and 4b are provided on an upper portion and the back gate electrode EG2 is provided on a lower portion in taking the channel layer 3 as their boundary. In other words, the back gate electrode EG2 is arranged inside the arch-shaped channel layer so as to pass through the source and drain layers 4a and 4b.

In the FINFET Q1 according to the first embodiment, current is carried through the front gate electrode EG1, the back gate electrode EG2, the source layer 4a, and the drain layer 4b described above, so that the current flowing in the arch-shaped channel layer 3 is controlled. For the control, the system of carrying the current through each member described above is provided.

A surface of an end portion in the extending front gate electrode EG1 is electrically connected with a contact plug 6 made of a conductor. Also, an end portion in the extending back gate electrode EG2 is formed so as to protrude above, and a surface of the end portion is electrically connected with the contact plug 6 made of a conductor. Note that, the back gate electrode EG2 is protruded above to be adjacent to the source and drain layers 4a and 4b. Here, in order to prevent electrical short of these members, for example, a sidewall spacer 5 is formed on a side wall portion where the back gate electrode EG2 is protruded. Also, surfaces of the source and drain layers 4a and 4b are electrically connected with the contact plug 6 made of a conductor. Further, a metal silicide layer 7 is formed on surfaces of the front gate electrode EG1, the back gate electrode EG2, the source layer 4a, and the drain layer 4b connected with the contact plugs 6 for achieving low resistance. Still further, the above-described structure is covered by an interface insulating film IL formed of a silicon oxide film or others, so that the contact plugs 6 or others are insulated from each other.

The above descriptions are for the structure of the FINFET Q1 which the semiconductor device according to the first embodiment has. Hereinafter, effects obtained by providing the structure as described above to the FINFET Q1 according to the first embodiment are described in detail.

The FINFET Q1 according to the first embodiment has two gate electrodes, more specifically the front gate electrode EG1 and the back gate electrode EG2, as gate electrodes providing the electric-field effect to the channel layer 3. In this manner, even when variation due to its manufacture process or its position on a wafer etc. is caused in the characteristics of the completed FINEFET Q1, the variation in the characteristics can be apparently cancelled by adjusting the characteristics with carrying the current through the back gate electrode EG2. Each FINFET Q1 or each block may be subjected to such a current carrying through the back gate electrode EG2. The effect can be caused even in a conventional FINFET as long as the FINFET has the structure with two gate electrodes.

On the other hand, the FINFET Q1 according to the first embodiment further has the structure in which each of gate electrodes EG1 and EG2 is arranged outside and inside the arch-shaped channel layer 3. That is, in the FINFET Q1 according to the first embodiment, the channel layer 3 has the arch shape, the inside of the fin-shaped is cut out, and the back gate electrode EG2 is arranged inside. In this manner, the front gate electrode EG1 can be formed over a wide area from the channel sidewall portion 3a to the channel crosspiece portion 3b on the outside surface of the channel layer 3. Therefore, the electric-field effect caused by the front gate electrode EG1 can be functioned on the wide area of the periphery portion of the channel layer 3, so that the area can be used as the channel. Since a current value in a FET is increased and decreased depending on a cross-sectional area of a channel (inversion layer), the current value is increased by using the wide area as the channel, so that a driving performance of the FET can be improved. As described above, without decreasing the driving performance, the FINFET Q1 having the two-gate-electrode structure causing the above-described effects can be achieved. As a result, the characteristics of the semiconductor device having the FINFET can be improved.

The inventors have studied on, for example, a structure in which the front gate electrode is arranged on one side wall of the fin-shaped channel layer and the back gate electrode is arranged on the other side wall. In the structure, although the characteristics can be adjusted by the back gate, the channel layer functioned by the front gate is provided only one side surface of the fin shape, and therefore, the current value is possibly decreased. For example, in order to increase the current value with using the structure, a method of heightening the fin is considered. However, a process for a fin shape with a high aspect ratio is more difficult, and as a result, it has been found out that the process becomes one cause of characteristic variation due to difference in a dimension. From this viewpoint, in the FINFET Q1 according to the first embodiment, a reason why the back gate electrode EG2 can be used without reducing the area functioned by the front gate electrode EG1 is the structure in which the back gate electrode EG2 is arranged inside the arch-shaped channel layer 3.

Also, the inventors have studied on, for example, a structure in which, in the fin-shaped channel layer, the back gate electrode is arranged in the substrate region below the fin without changing the structure (reducing the area) of the portion covered by the front gate electrode. In the structure, although the current value is not decreased, the electric-field effect caused by the back gate is difficult to be functioned on a top portion away from a bottom portion of the fin, and therefore, it has been found out that the effect of the characteristic adjusting is difficult to be obtained. From this viewpoint, in the FINFET Q1 according to the first embodiment, a reason why the electric-field effect caused by the back gate electrode EG2 can be functioned all over the channel layer 3 is the structure in which the inside of the fin-shaped channel layer 3 is cut out and the back gate electrode EG2 is arranged inside.

Further, as described above, the FINFET Q1 according to the first embodiment has the structure in which the front gate electrode EG1 and the back gate electrode EG2 are arranged so as to cross each other when they are flatly viewed. Here, in the FINFET Q1 according to the first embodiment, the structure in which the channel layer 3 has the arch shape and gate electrodes are individually arranged inside and outside of the arch shape is effective, and from this viewpoint, the structure is similarly effective even when these gate electrodes are not crossed with each other. However, from a viewpoint of a device layout, the structure in which the gates are crossed with each other as described above is more preferable. Hereinafter, this reason is described.

Since the back gate electrode EG2 is the member buried inside the arch-shaped channel layer 3, the crossing of the front gate electrode EG1 with the back gate electrode EG2 means the crossing of the front gate electrode EG1 with the extending direction of the channel layer 3. In this manner, as described above, the front gate electrode EG1 can be arranged so as to pass over the plurality of channels. By combining the plurality of channel layers 3 in this manner, it is not required to form the contact plug 6 in each FINFET Q1, and therefore, area efficiency can be further improved. In this manner, further downsizing for the semiconductor device is possible. As a result, the characteristics of the semiconductor device having the FINFET can be further improved.

Still further, as described above, the FINFET Q1 according to the first embodiment has the structure in which the back gate electrode EG2 is pulled out so as to pass through the source layer 4a and the drain layer 4b and is connected with the contact plug 6. Here, in the FINFET Q1 according to the first embodiment, the structure in which the channel layer 3 has the arch shape and gate electrodes are individually arranged inside and outside of the arch shape is effective, and from this viewpoint, the structure is similarly effective even when the back gate electrode EG2 is not passed below the source and drain layers 4a and 4b. However, from a viewpoint of a contact margin, the structure in which the back gate electrode EG2 passes through the source and drain layers 4a and 4b and is connected with the contact plug 6 as described above is more preferable. Hereinafter, this reason is described.

By pulling out the back gate electrode EG2 so as to pass through the source and drain layers 4a and 4b, a planar margin of the contact plug 6 with respect to the back gate electrode EG2 is easily secured. More specifically, the back gate electrode EG2 is pulled outer than the source and drain layers 4a and 4b. Therefore, in the back gate electrode EG2 and the source and drain layers 4a and 4b constitutionally arranged close to each other, each contact plug 6 can be formed so as to have the planar margin. In this manner, further downsizing of the semiconductor device is possible. As a result, the characteristics of the semiconductor device having the FINFET can be further improved.

Still further, as described above, the FINFET Q1 according to the first embodiment has the structure in which the front gate is arranged outside the arch-shaped channel layer 3 and the back gate is arranged inside. Here, in the FINFET Q1 according to the first embodiment, the structure in which the channel layer 3 has the arch shape and gate electrodes are individually arranged inside and outside of the arch shape is effective, and from this viewpoint, the structure is similarly effective even when either of these gate electrodes is functioned as the front gate or back gate. However, from a viewpoint of arranging the gate electrodes with using a structural advantage, the structure in which the front gate is arranged outside the channel layer 3 and the back gate is arranged inside as described above is more preferable. Hereinafter, this reason is described.

In the structure in which the gate electrode (back gate electrode EG2) is arranged inside the arch-shaped channel layer 3, the gate electrode is arranged directly below the source and drain layers 4a and 4b through the channel layer 3 and the gate insulating film (back-gate insulating film IG2). In order to obtain desired characteristics in the FINFET Q1, influence (electrical interference) of the electric field caused by the gate electrode (back gate electrode EG2) to the source and drain layers 4a and 4b is desirably decreased as much as possible. Accordingly, it is desirable to thicken the gate insulating film (back-gate insulating film IG2) inside the arch-shaped channel layer 3. However, a thickness of a gate insulating film to be used as the front gate is determined by electrical characteristics required for the FINFET Q1. Therefore, in order to decrease the influence of the electric field to the source and drain layers 4a and 4b, it is required to thicken the gate insulating film. It is more preferable to use the gate insulating film inside the channel layer 3 as the back gate. That is, as described above, it is more preferable to use the gate insulating film and the gate electrode outside the channel layer 3 as the front-gate insulating film IG1 and the front gate electrode EG1, respectively, and the gate insulating film and the gate electrode inside the same as the back-gate insulating film IG2 and the back gate electrode EG2, respectively. And, the back-gate insulating film IG2 is thicker than the front-gate insulating film IG1. In this manner, without causing the influence of the electric field caused by the back gate electrode EG2 to the source and drain layers 4a and 4b, it is possible to achieve the structure causing the effects of improving the characteristics of the FINFET Q1 as described above. As a result, the characteristics of the semiconductor device having the FINFET can be further improved.

Next, a method of manufacturing the semiconductor device having the FINFET Q1 according to the first embodiment with the above-described effects is described with reference to FIGS. 3 to 17. FIGS. 3 to 17 are plan views of principal parts in the manufacture step for the regions corresponding to FIG. 1 or 2, or their cross-sectional views of principal parts. Hereinafter, more specifically, a step of forming, on the silicon substrate 1, the FINFET Q1 which the semiconductor device according to the first embodiment has is described. Note that, among members formed by steps described below, a member with the same symbol as that described with reference to FIGS. 1 and 2 has the same characteristics such as a thickness and a material as well unless otherwise stated. Also, conductive types of the substrate and the semiconductor region are fixedly described for convenience. However, the conductive types are arbitrarily combined, and are not limited to the following descriptions.

Figure 3:
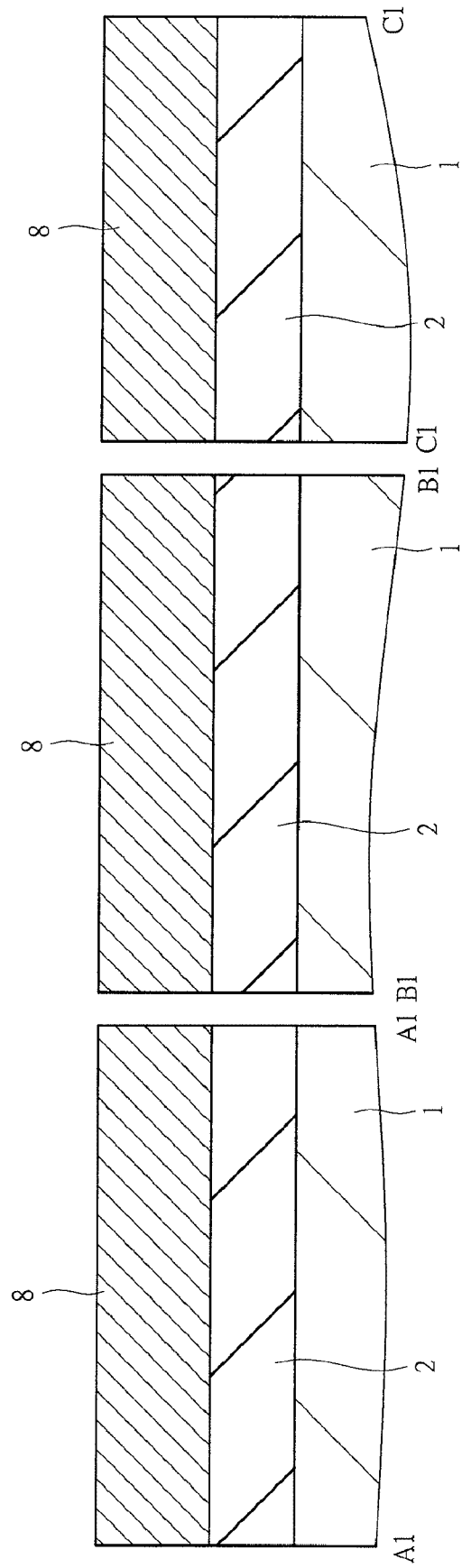
FIG. 3 is cross-sectional views of principal parts in a manufacture step of the semiconductor device according to the first embodiment of the present invention which are regions corresponding to those in FIG. 2.

First, as illustrated in FIG. 3, there is prepared a SiGe-on-insulator (SGOI) substrate having: a first semiconductor layer 8 made of silicon germanium (SiGe) and provided on a top layer of the semiconductor substrate 1; and an insulating layer 2 buried between the semiconductor substrate 1 and the first semiconductor layer 8. Here, a silicon oxide film is formed on the first semiconductor layer 8 by, for example, a thermal oxidation method, and then, the silicon oxide film is removed, so that the first semiconductor layer 8 is thinned so as to have a desired thickness. Here, a channel area described later is increased by the thickness of the first semiconductor layer 8, and therefore, the driving performance of the FET can be improved. On the other hand, by the thickness of the first semiconductor layer 8, a difficulty of the step of forming the FET is increased. From these viewpoints, in the manufacturing method according to the first embodiment, the thickness of the first semiconductor layer 8 is set to 200 nm or thinner. At this time, as the SGOI substrate, a SiGe/SOI substrate may be used in which, a Si-on-insulator (SOI) substrate having a silicon layer on a buried insulating film is used, the SOI layer is thinned to, for example, about 20 nm or thinner, and the SiGe layer is formed on the SOI layer by epitaxial growth.

Figure 4:
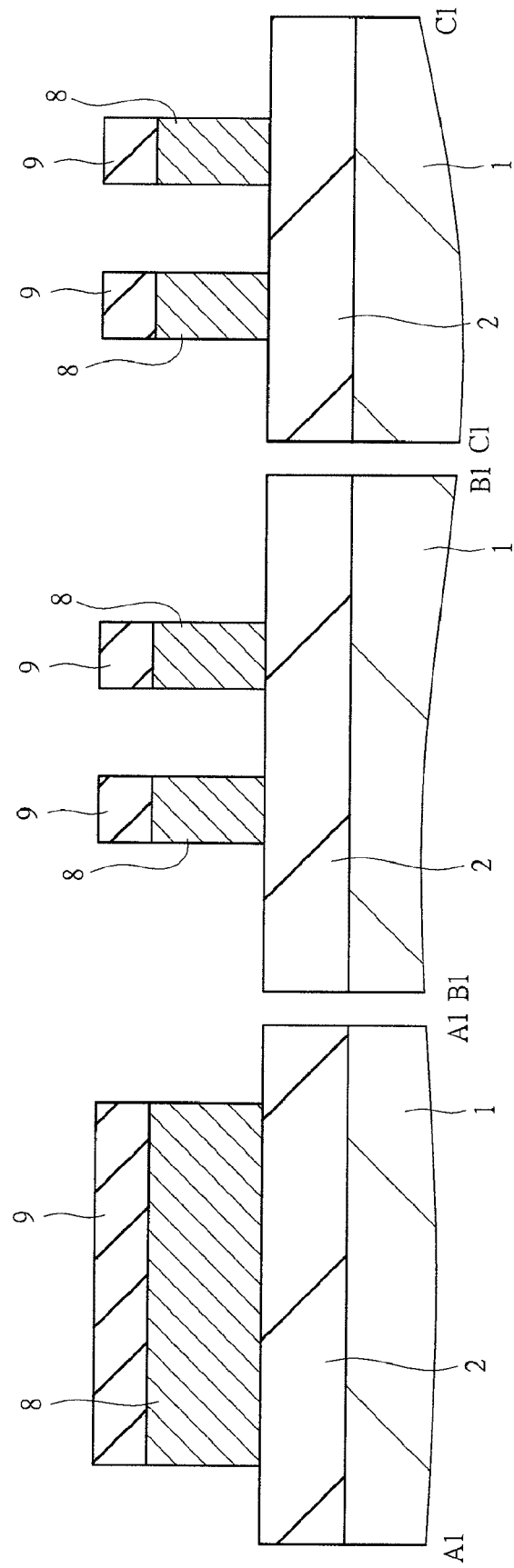
FIG. 4 is cross-sectional views of the principal parts in the manufacture step of the semiconductor device continued from FIG. 3.

Next, as illustrated in FIG. 4, a cap oxide film 9 made of silicon oxide is formed so as to cover the first semiconductor layer 8. The cap oxide film is formed by oxidizing a surface of the first semiconductor layer 8 made of SiGe by, for example, a thermal oxidation method. And then, the cap oxide film 9 is patterned by a sequential photolithography method, etching method, and others. Subsequently, the first semiconductor layer 8 is subjected to dry etching with using the patterned cap oxide film 9 as an etching mask, so that the first semiconductor layer 8 is processed. That is, the first semiconductor layer 8 is processed in the same planar-pattern shape as that of the cap oxide film 9. And then, the cap oxide film 9 is removed by selective etching or others.

Note that the sequential photolithography method includes a sequential step of coating a photoresist film, exposure, development, and others, and is a technique of transferring a desired pattern on the photoresist film. And, a process-target film is subjected to dry etching with using the photoresist film as an etching mask, so that the process-target film is processed in the same planar-pattern shape as that of the photoresist film. And then, the photoresist film is removed, so that the process-target film is patterned. Thereafter, a step of patterning a predetermined film by the sequential photolithography method, etching method, and others is the same as above.

Here, the first semiconductor layer 8 is subjected to the above-described step so as to have the fin shape extending in one direction (for example, direction along line A1-A1) when the main surface of the silicon substrate 1 is flatly viewed. The fin-shaped first semiconductor layer 8 defines the arch shape of the channel layer 3 illustrated in FIG. 2 and others as described in detail later.

In the FINFET structure studied by the inventors, it is required to thin the fin and form the fin as a thickness-uniformed film with low roughness so that the fin-shaped first semiconductor layer 8 is functioned as the channel. It is difficult to uniformly form such a thin fin, and therefore, it is difficult to suppress the short-channel effect in a portion where the fin is thickly formed because the fin inside cannot be completely depleted depending on the gate. Also, in the ununiform fin, FET characteristics are varied by its uniformity. On the other hand, in the FINFET Q1 according to the first embodiment, the first semiconductor layer 8 is not used as the channel layer 3 as clearly seen also from the structure described with reference to FIGS. 1 and 2. Effects obtained by not using the first semiconductor layer 8 as the channel layer 3 will be described in detail later.

Figure 5:
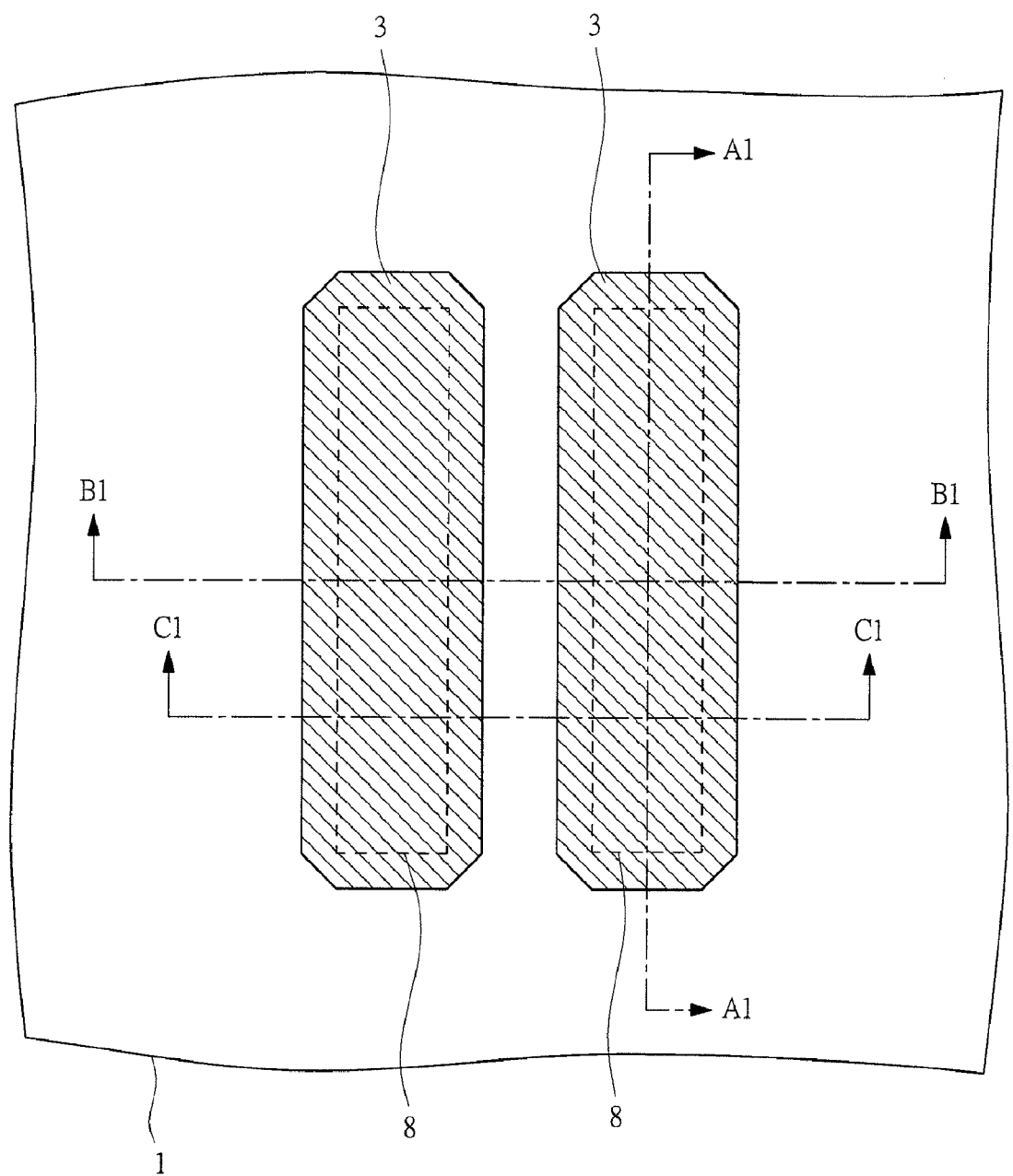
FIG. 5 is a plan view of a principal part in the manufacture step of the semiconductor device continued from FIG. 4.
Figure 6:
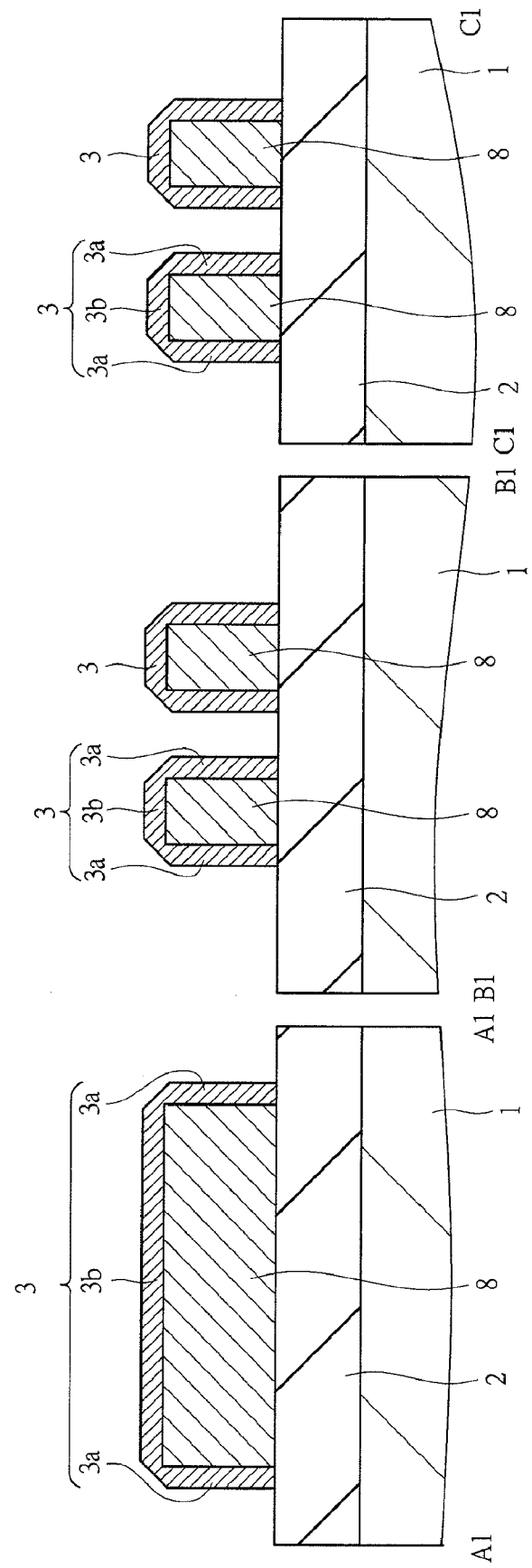
FIG. 6 is cross-sectional views of the principal parts in the manufacture step of the semiconductor device continued from FIG. 4 which correspond to lines A1-A1, B1-B1, and C1-C1 in FIG. 5.

Next, as illustrated in FIGS. 5 and 6, the channel layer 3 is formed so as to cover the fin-shaped first semiconductor layer 8. Here, monocrystalline silicon is crystal-grown on the surface of the first semiconductor layer 8 made of SiGe by an epitaxial growth method, so that the channel layer 3 is formed so as to cover the first semiconductor layer 8. In the epitaxial growth, a growth layer is formed in accordance with a monocrystalline layer to be a base, and therefore, the channel layer 3 is formed so as to cover the fin-shaped first semiconductor layer 8 made of monocrystalline SiGe, and is not formed on other portions (for example, the insulating layer 2 or others). At this time, the channel sidewall portion 3a is formed so as to cover the side wall of the first semiconductor layer 8 and to arrange in the direction crossing the main surface of the silicon substrate 1. Also, the channel crosspiece portion 3b is formed so as to cover the top portion of the first semiconductor layer 8 and to arrange in the direction along the main surface of the silicon substrate 1.

Further, the channel layer 3 is the member functioning as the channel of the FINFET Q1, and a thickness of the growth layer is one-third the gate length or smaller. In the method of manufacturing the semiconductor device according to the first embodiment, effects obtained by forming the channel layer 3 by the epitaxial growth method as described in the present step will be described in detail later.

Figure 7:
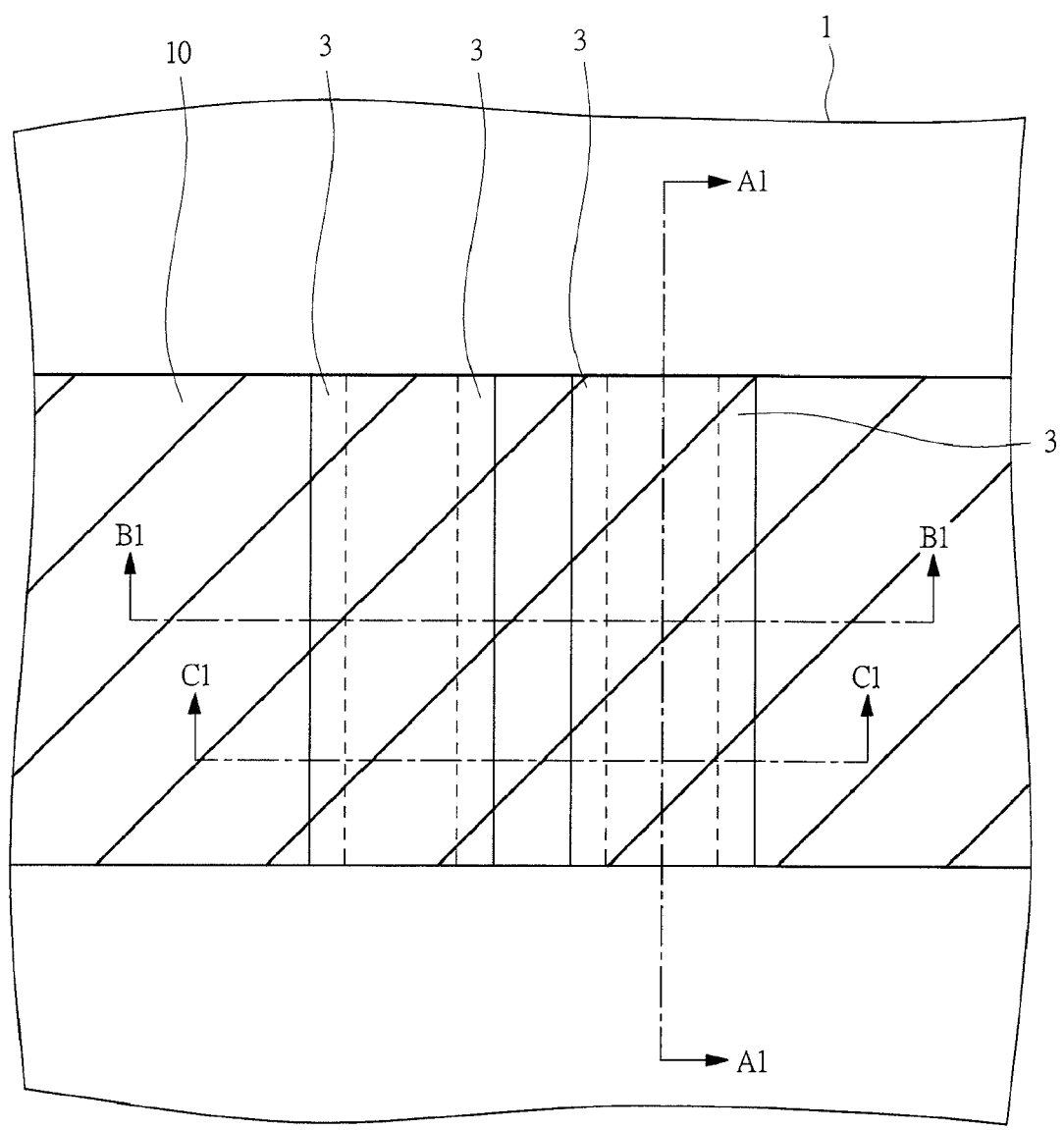
FIG. 7 is a plan view of the principal part in the manufacture step of the semiconductor device continued from FIG. 6.
Figure 8:
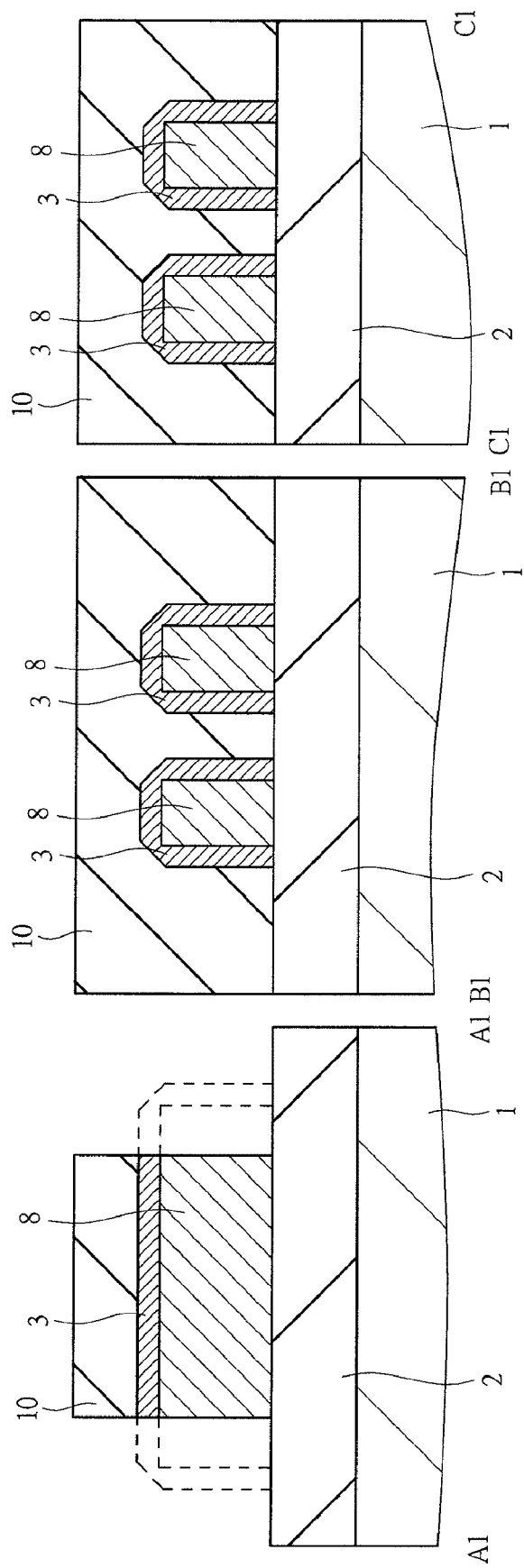
FIG. 8 is cross-sectional views of the principal parts in the manufacture step of the semiconductor device continued from FIG. 6 which correspond to lines A1-A1, B1-B1, and C1-C1 in FIG. 7.

Next, as illustrated in FIGS. 7 and 8, a cap nitride film 10 formed of a silicon nitride film is formed on the silicon substrate 1 by, for example, a chemical vapor deposition (CVD) method or others. And then, the cap nitride film 10 is patterned by the sequential photolithography method, etching method, and others. Here, the cap nitride film 10 is patterned so as to expose the end portion in the longitudinal direction extending in the fin shape in the channel layer 3 covered by the cap nitride film 10.

And then, the channel layer 3 on the exposed portion from the cap nitride film 10 is removed by an etching method. Subsequently, the first semiconductor layer 8 on the exposed portion from the channel layer 3 and the cap nitride film 10 is removed by an etching method. By the present step, the side surface of the first semiconductor layer 8 having been covered by the channel layer 3 until the previous step is exposed in the end portion extending in the fin shape.

Figure 9:
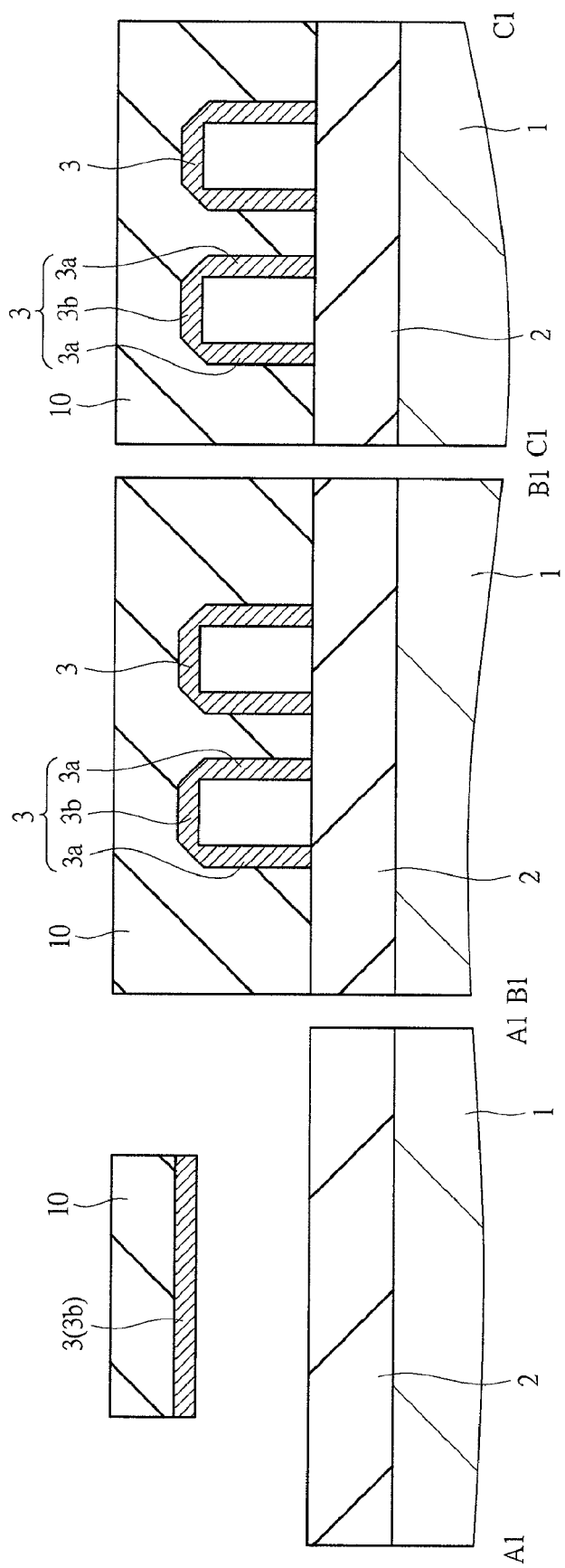
FIG. 9 is cross-sectional views of the principal parts in the manufacture step of the semiconductor device continued from FIG. 8.

Next, a structure as illustrated in FIG. 9 is formed by removing the first semiconductor layer 8 covered by the channel layer 3. Here, after the step of FIG. 8, the first semiconductor layer 8 exposed from the channel layer 3 and the cap nitride film 10 is selectively subjected to wet etching to be removed. Since the cap nitride film 10 is formed of a silicon nitride film, the channel layer 3 is made of monocrystalline silicon, and the insulating layer 2 is formed of a silicon oxide film, the first semiconductor layer 8 made of SiGe can be selectively removed by the wet etching.

In the method of manufacturing the semiconductor device according to the first embodiment, by the above steps, the channel layer 3 can be processed in the arch shape so as to have: the channel sidewall portion 3a arranged in the direction crossing the main surface of the silicon substrate 1; and the channel crosspiece portion 3b arranged in the direction along the main surface so as to connect between top portions of two channel sidewall portions 3a.

Figure 10:
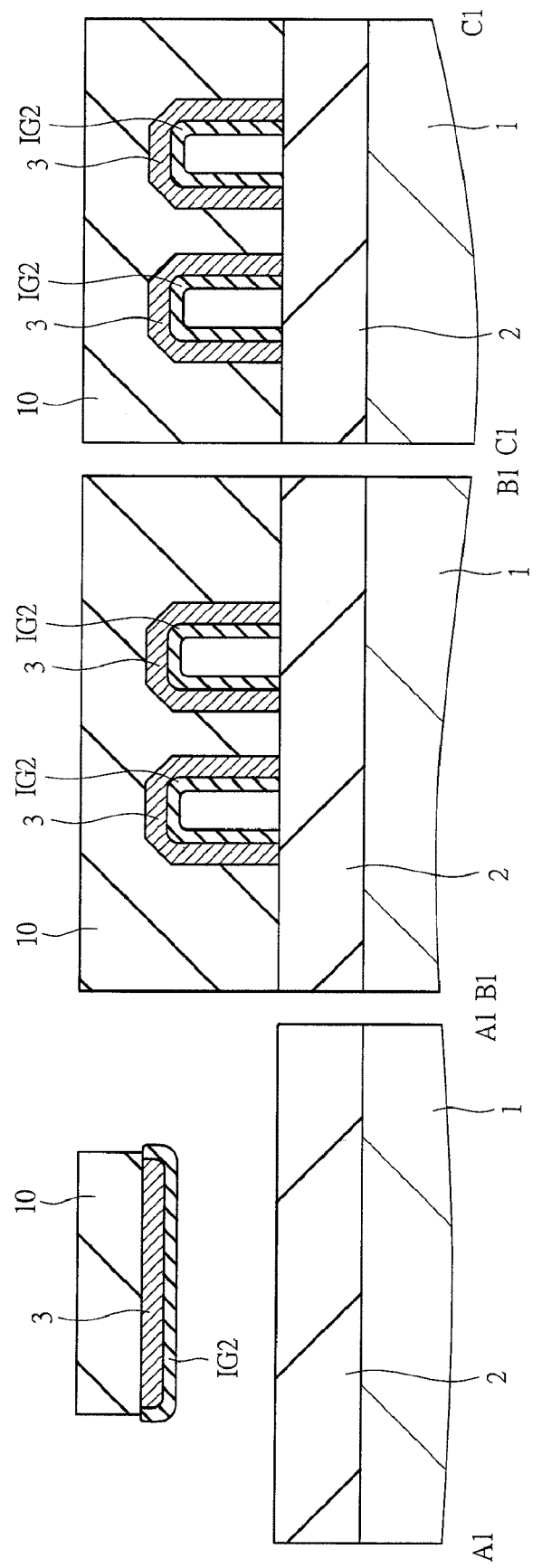
FIG. 10 is cross-sectional views of the principal parts in the manufacture step of the semiconductor device continued from FIG. 9.

Next, as illustrated in FIG. 10, a back-gate insulating film IG2 is formed so as to cover the inside of the arch-shaped channel layer 3. The inside wall of the arch-shaped channel layer 3 is oxidized by, for example, a thermal oxidation method or others, so that the back-gate insulating film IG2 formed of an insulator mainly made of silicon oxide is formed. At this time, since the cap nitride film 10 has been formed so as to cover the channel layer 3 until the previous step, the oxide film is not formed outside the arch-shaped channel layer 3.

Figure 11:
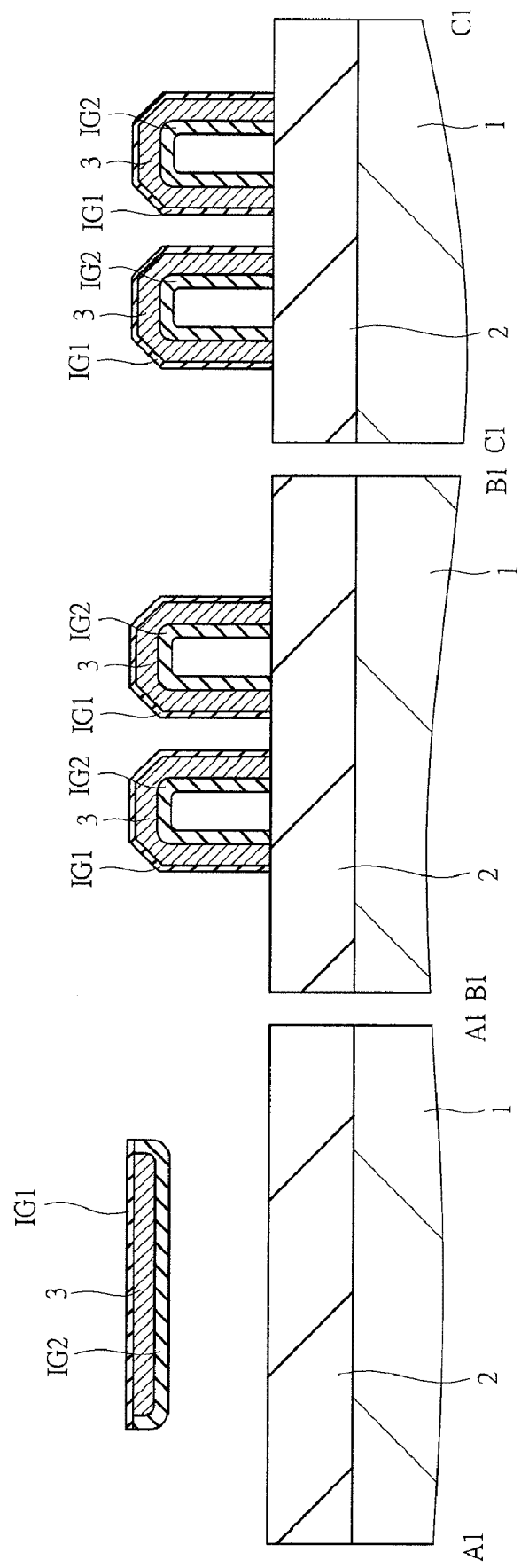
FIG. 11 is cross-sectional views of the principal parts in the manufacture step of the semiconductor device continued from FIG. 10.

Next, as illustrated in FIG. 11, the cap nitride film 10 covering the arch-shaped channel layer 3 is removed by a wet etching method or others. And then, the front-gate insulating film IG1 is formed so as to cover the outside of the arch-shaped channel layer 3. The outside wall of the arch-shaped channel layer 3 is oxidized by, for example, a thermal oxidation method or others, so that the front-gate insulating film IG1 formed of an insulator mainly made of silicon oxide is formed. At this time, the inside wall of the channel layer 3 is oxidized as well. Since the back-gate insulating film IG2 is formed on the inside wall of the channel layer 3 in the previous step, the back-gate insulating film IG2 is further thickened in the present step. As a result, each of the gate insulating films IG1 and IG2 is formed so that the back-gate insulating film IG2 is thicker than the front-gate insulating film IG1.

Here, although materials of both gate insulating films IG1 and IG2 are described above as the insulating film mainly made of silicon oxide formed by the thermal oxidation method, the materials are not limited to this. When an insulating film other than the silicon oxide film as described in FIGS. 1 and 2 is used, both of the gate insulating films IG1 and IG2 may be formed by a CVD method, an atomic layer deposition (ALD) method, or others.

Figure 12:
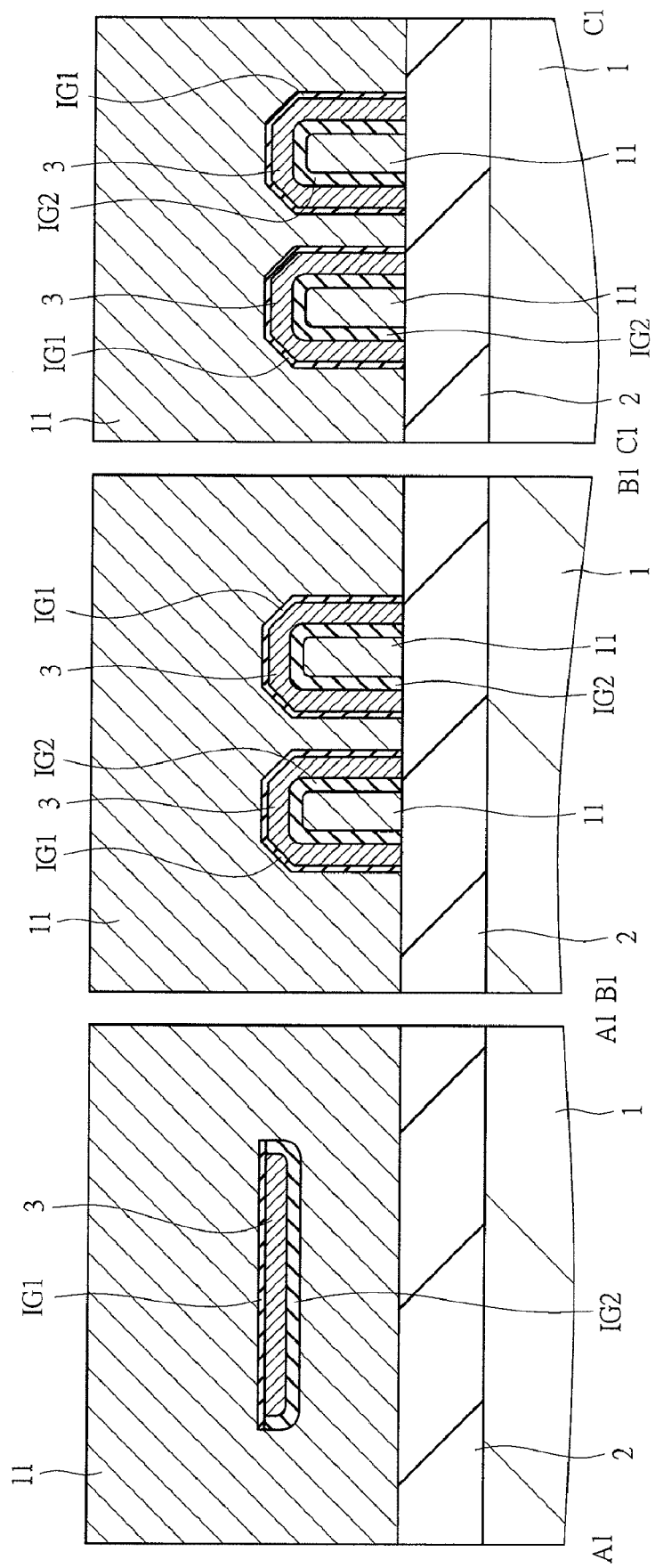
FIG. 12 is cross-sectional views of the principal parts in the manufacture step of the semiconductor device continued from FIG. 11.

Next, as illustrated in FIG. 12, a gate conductive film 11 is formed so as to cover the arch-shaped channel layer 3. At this time, the gate conductive film 11 is formed so as to be integrally buried inside the arch-shaped channel layer 3. More particularly, the gate conductive film 11 inside the arch-shaped channel layer 3 is buried inside so as not to provide disconnection to be the back gate electrode EG2 in a later step. In the present step, for example, polysilicon is formed as the gate conductive film 11. However, the insulator used for the gate electrodes EG1 and EG2 described with reference to FIGS. 1 and 2 may be used for the gate conductive film 11. Either way, the gate conductive film 11 is formed by a CVD method or others.

And then, the deposited gate conductive film 11 is flattened by, for example, a chemical mechanical polishing (CMP) method or others as needed.

Figure 13:
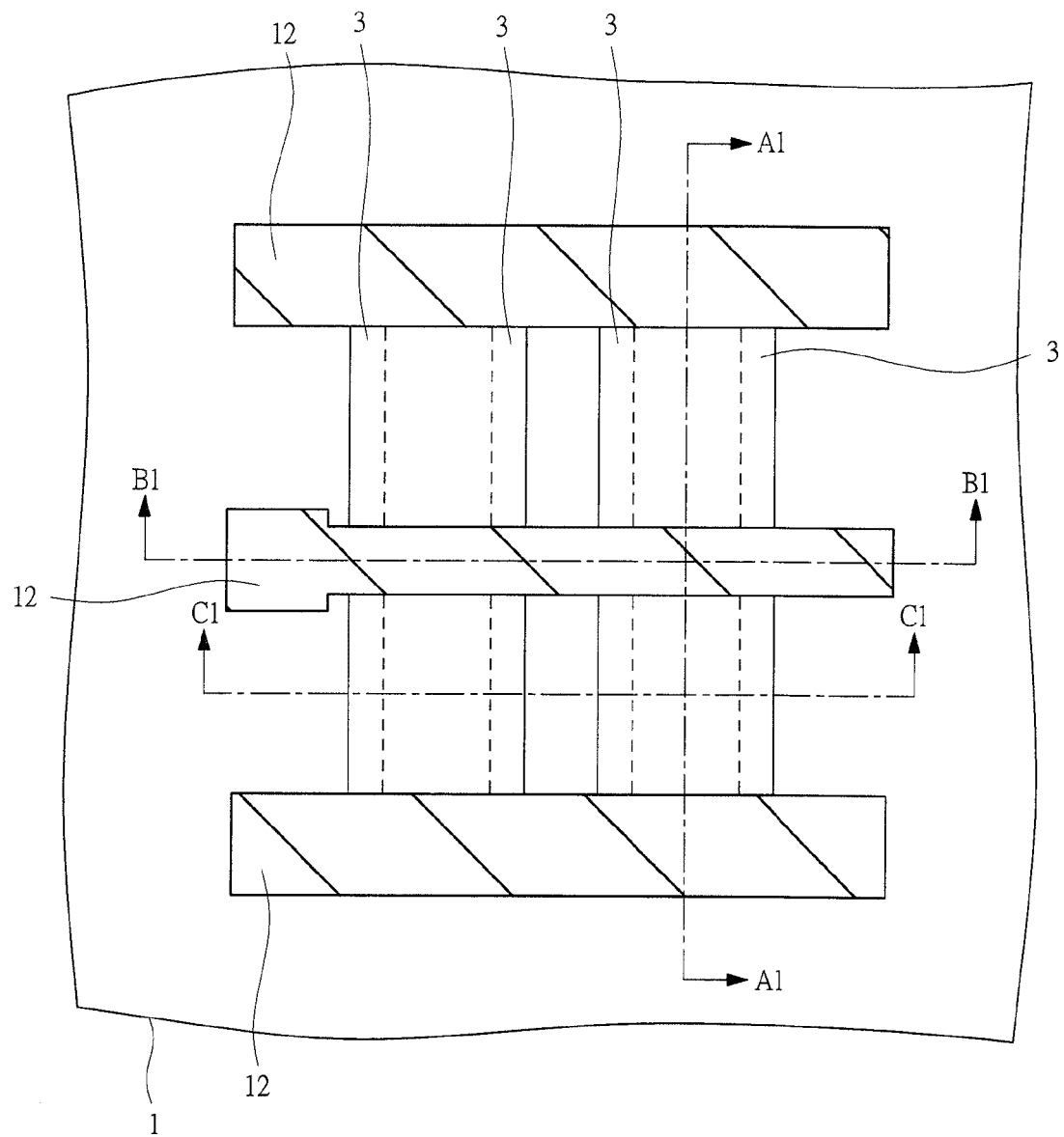
FIG. 13 is a plan view of the principal parts in the manufacture step of the semiconductor device continued from FIG. 12.
Figure 14:
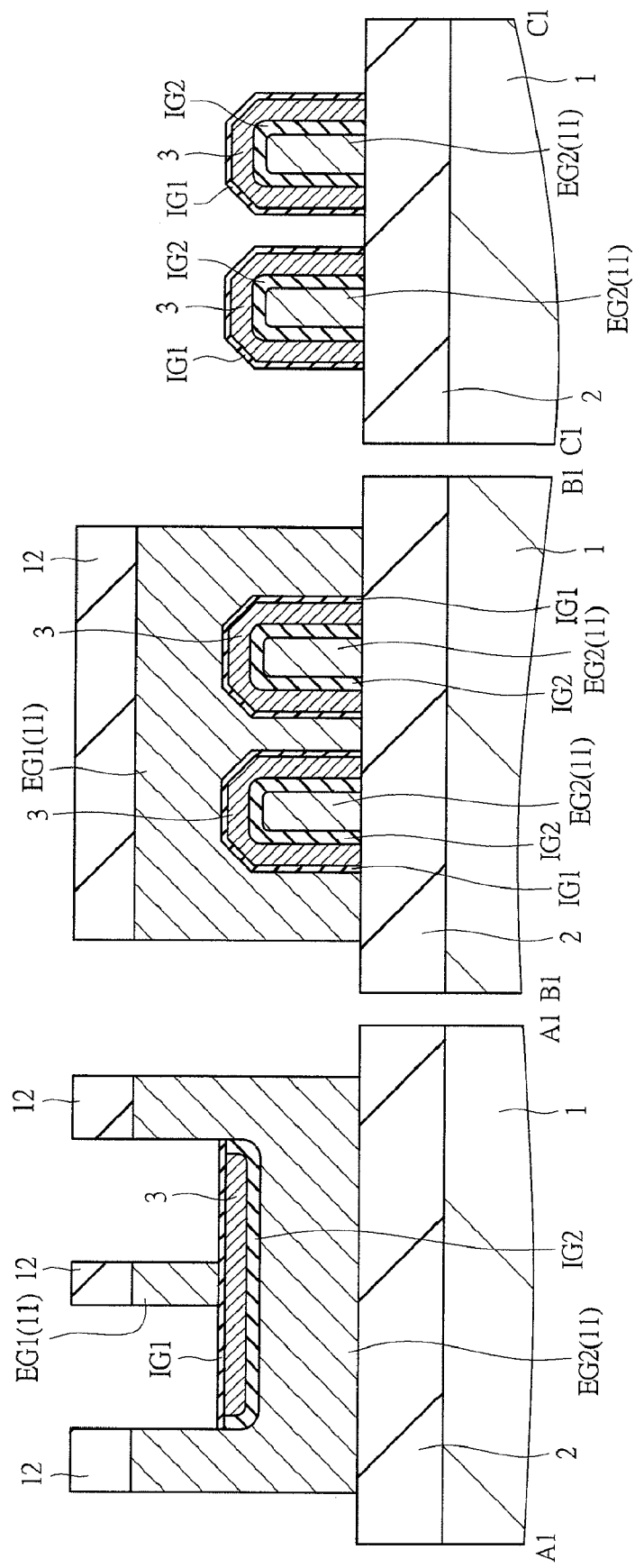
FIG. 14 is cross-sectional views of the principal parts in the manufacture step of the semiconductor device continued from FIG. 12 which correspond to lines A1-A1, B1-B1, and C1-C1 in FIG. 13.

Next, as illustrated in FIGS. 13 and 14, a cap oxide film 12 formed of a silicon oxide film is formed so as to cover the gate conductive film 11 by a CVD method or others. And then, the cap oxide film 12 is patterned by the sequential photolithography method, etching method, and others. The cap oxide film 12 is used as an etching mask with which the gate conductive film 11 is subjected to etching for its shape process in a later step. That is, the cap oxide film 12 is patterned so as to cover a desirably-remained portion of the gate conductive film 11 in the later etching step. Here, the cap oxide film 12 is patterned in the same planar-pattern shape as those of the front-gate and back gate electrodes EG1 and EG2 described in FIGS. 1 and 2.

And then, the gate conductive film 11 is subjected to dry etching with using the cap oxide film 12 as the etching mask, so that the gate conductive film 11 is processed in the same planar-pattern shape as that of the cap oxide film 12. In this manner, the front gate electrode EG1 formed of the gate conductive film 11 is formed so as to cover a part of the channel layer 3 through the front-gate insulating film IG1. Also, the back gate electrode EG2 formed of the gate conductive film 11 is formed so as to be buried inside the channel layer 3 through the back-gate insulating film IG1.

Figure 15:
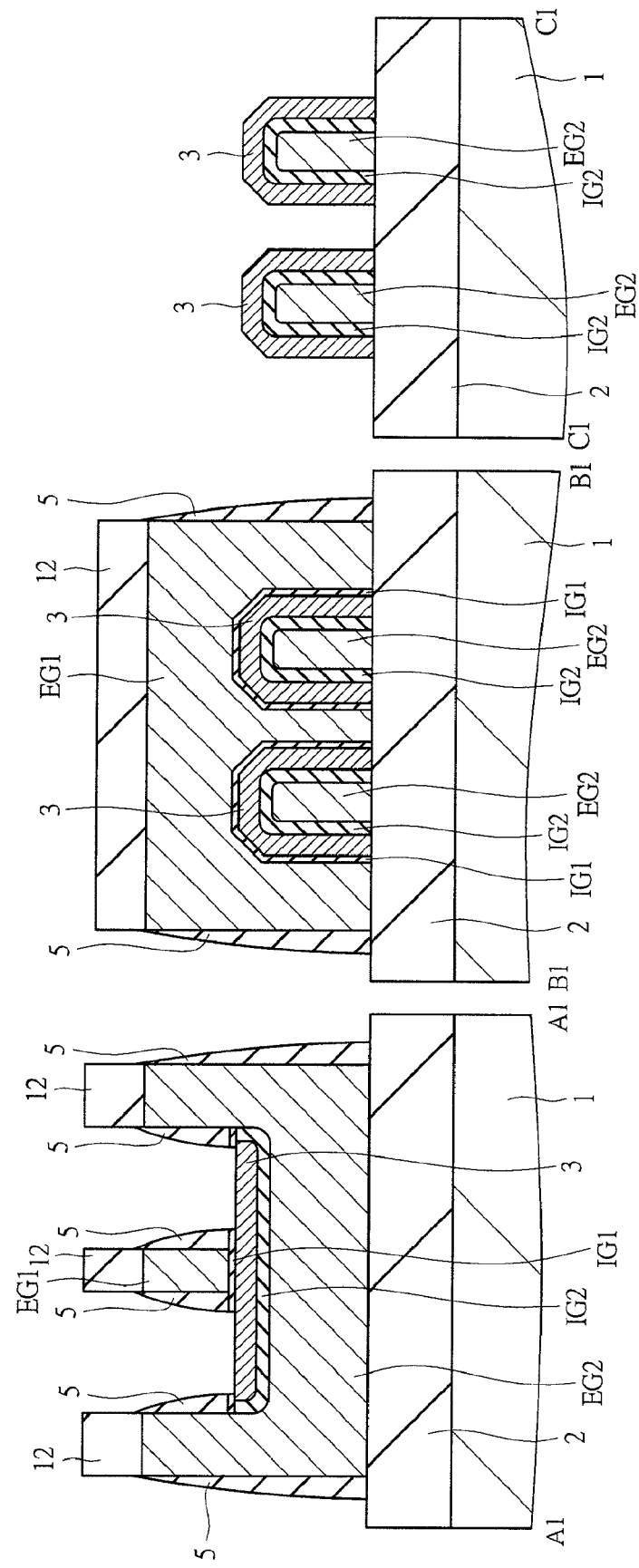
FIG. 15 is cross-sectional views of the principal parts in the manufacture step of the semiconductor device continued from FIG. 14.

Next, a silicon nitride film is formed so as to cover the silicon substrate 1, and then, its whole surface is subjected to anisotropic etching (etching back), so that a sidewall spacer 5 is formed so as to cover the sidewall portion of the uneven member to provide a structure as illustrated in FIG. 15.

Through the etching step and a subsequent rinsing step for forming the above-described sidewall spacer 5, the front-gate insulating film IG1 formed of a silicon oxide film on a flat portion is simultaneously removed as well. In this manner, it is possible to self-aligningly expose the channel layer 3 in regions where the source and drain layers 4a and 4b (see FIGS. 1 and 2) are to be formed in a later step. And then, the channel layer 3 in the exposed portion is subjected to ion implantation as needed. In this manner, a thin diffusion layer (extension region) can be self-aligningly formed on the channel layer 3 in the side-below portion of the front gate electrode EG1.

Figure 16:
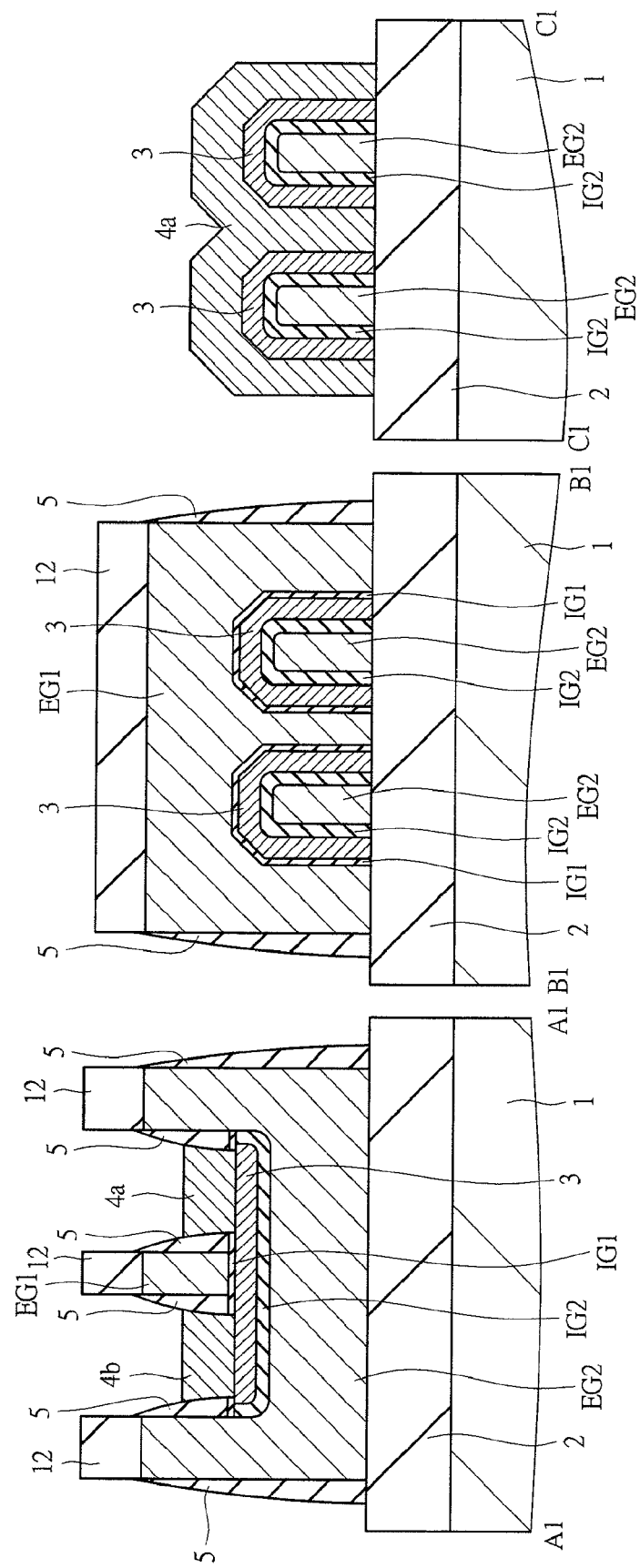
FIG. 16 is cross-sectional views of the principal parts in the manufacture step of the semiconductor device continued from FIG. 15.

Next, as illustrated in FIG. 16, the source and drain layers 4a and 4b formed of the insulator mainly made of monocrystalline silicon are formed so as to cover the channel layer 3 in the exposed portion in the previous step. For example, the same monocrystalline silicon is epitaxially grown on the exposed portion of the channel layer 3 made of monocrystalline silicon, so that the source and drain layers 4a and 4b can be formed. Note that, prior to forming the source and drain layers 4a and 4b, it is desirable to remove a spontaneous-oxidized film on a surface of the channel layer 3 in the exposed portion by rinsing the film with hydrofluoric acid.

Subsequently, by the ion implantation, the diffusion layer is self-aligningly formed on a surface of or inside each of the source and drain layers 4a and 4b, so that the source and drain layers 4a and 4b each having a desired electric conductivity is formed. After the above steps, the cap oxide film 12 is removed by rinsing with hydrofluoric acid or others.

Figure 17:
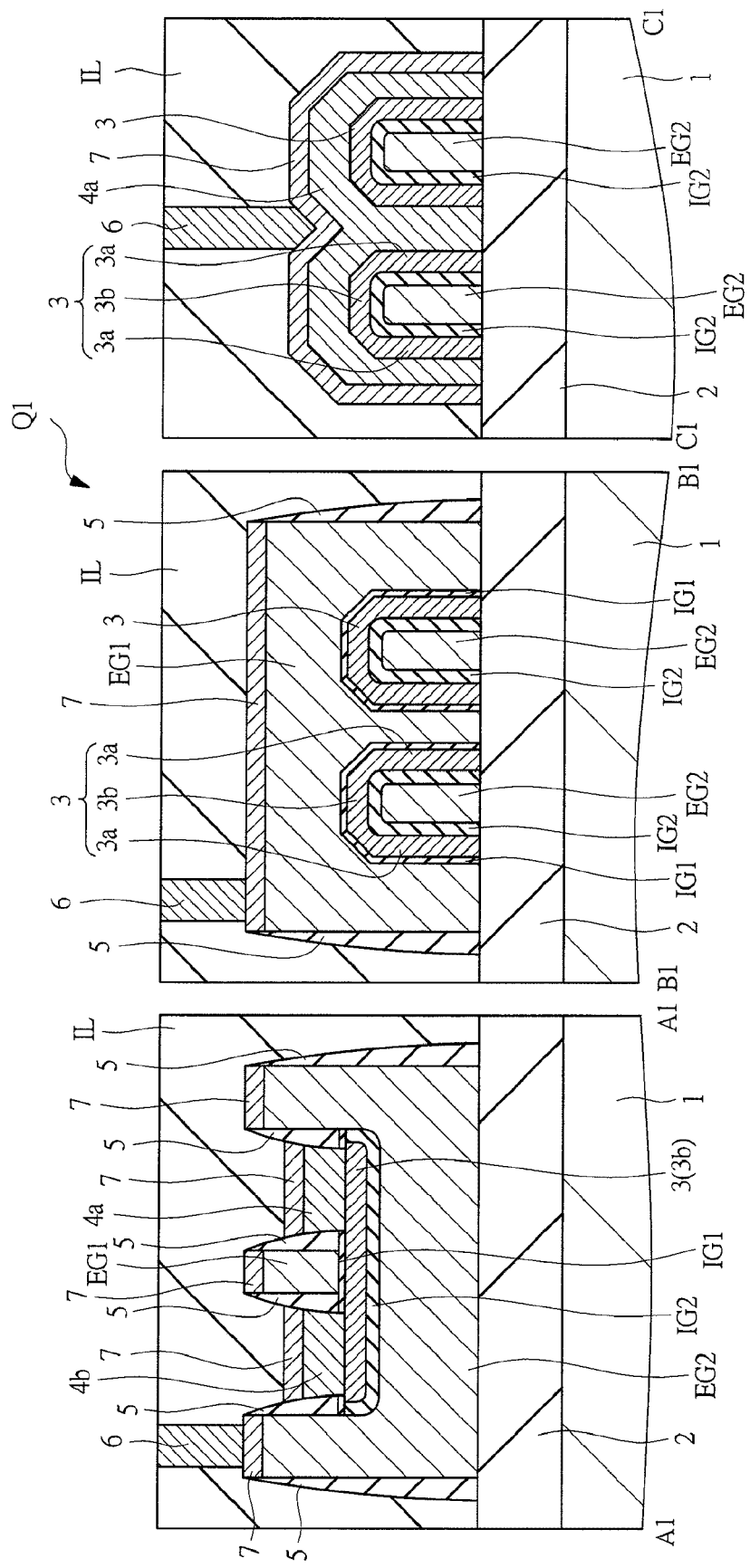
FIG. 17 is cross-sectional views of the principal parts in the manufacture step of the semiconductor device continued from FIG. 16.

Next, as illustrated in FIG. 17, by whole-surface coating of a Ni film by, for example, a sputtering method, a thermal treatment to the Ni film, and removing of unreacted Ni, a metal silicide layer 7 is self-aligningly formed on surfaces of the front gate electrode EG1, the back gate electrode EG2, the source layer 4a, and the drain layer 4b.

And then, an interlayer insulating film IL formed of a stacked film of a silicon oxide film and a contact etch stopper (CESL) film of a silicon nitride film is deposited for flattening. Subsequently, there is formed a contact plug 6 reaching the metal silicide layer 7 formed on the front gate electrode EG1, the back gate electrode EG2, the source layer 4a, and the drain layer 4b. In a subsequent step, by forming and patterning a metal wire, forming an interlayer insulating film, forming a via plug, and others, a desired multilayer wiring (not illustrated) is formed.

By the steps as described above, the FINFET Q1 which the semiconductor device according to the first embodiment has as described in FIGS. 1 and 2 can be formed. As described above, in the FINFET Q1 having such a structure according to the first embodiment, characteristics of the semiconductor device can be improved.

In the method of manufacturing the semiconductor device according to the first embodiment, as described with reference to FIGS. 5 and 6, the formation of the channel layer 3 is exemplified such that monocrystalline silicon is epitaxially grown on the fin-shaped first semiconductor layer 8 for the formation. Here, the structure in which the arch-shaped channel layer 3 is formed and two gate electrodes are arranged inside and outside the channel layer 3 is effective, and the structure is similarly effective regardless of using the epitaxial growth method as the deposition method of the channel layer 3. However, from a viewpoint of decreasing the variation in the thickness of the channel layer 3, as the manufacture method according to the first embodiment, the formation of the arch-shaped channel layer 3 by the epitaxial growth method is more preferable. Hereinafter, this reason is described.

In the manufacture method according to the first embodiment, as described above, the fin-shaped first semiconductor layer 8 own is not used as the channel of the FINFET Q1, and the arch-shaped monocrystalline silicon formed on the surface of the fin-shaped first semiconductor layer 8 is used as the channel layer 3. In this manner, even when a dimension of the fin-shaped first semiconductor layer 8 formed by the photolithography method and etching method is varied, a channel width of the FET can be uniformly formed as a result as long as the thickness of the channel layer 3 deposited on the surface is uniformed. And, as means of uniformly forming the thickness of the monocrystalline silicon layer, the epitaxial growth method is suitable. This is because the thickness of the growing layer can be controlled at an atomic-layer level by the epitaxial growth method. By using the epitaxial growth method as the means of forming the channel layer 3 as described above, the variation in the dimension of the FINFET Q1 can be decreased. As a result, characteristics of the semiconductor device having the FINFET can be further improved.

Also, in the method of manufacturing the semiconductor device according to the first embodiment, the formation of the front-gate insulating film IG1 and the back-gate insulating film IG2 by the different step from each other is exemplified. Here, the structure in which the arch-shaped channel layer 3 is formed and two gate electrodes are arranged inside and outside the channel layer 3 is effective, and the structure is similarly effective regardless of the method of forming the gate insulating films. However, from viewpoints of forming a suitable structure for a stable operation and improving characteristics, as the first embodiment, the formation of the two gate insulating films IG1 and IG2 by the different step from each other is more preferable. Hereinafter, this reason is described.

In the manufacture method according to the first embodiment, as described above, the inside of the arch-shaped channel layer 3 is subjected to thermal oxidation first, so that the back-gate insulating film IG2 is formed first. And then, the outside of the arch-shaped channel layer 3 is subjected to thermal oxidation, so that the front-gate insulating film IG1 is formed. Here, when the front-gate insulating film IG1 is formed, the inside of the arch-shaped channel layer 3 is not protected and is similarly subjected to the thermal oxidation. Therefore, the back-gate insulating film IG2 is thickened. As described with reference to FIGS. 1 and 2, in the FINFET Q1 according to the first embodiment, it is effective that the back-gate insulating film IG2 is formed thicker than the front-gate insulating film IG1. In this manner, by using the manufacture method as described above, the back-gate insulating film IG2 can be formed thicker than the front-gate insulating film IG1, so that it is possible to achieve the FINFET having the back-gate structure which is hard to cause the electrical interference to the source and drain layers 4a and 4b. As a result, characteristics of the semiconductor device having the FINFET can be further improved.

Figure 18:
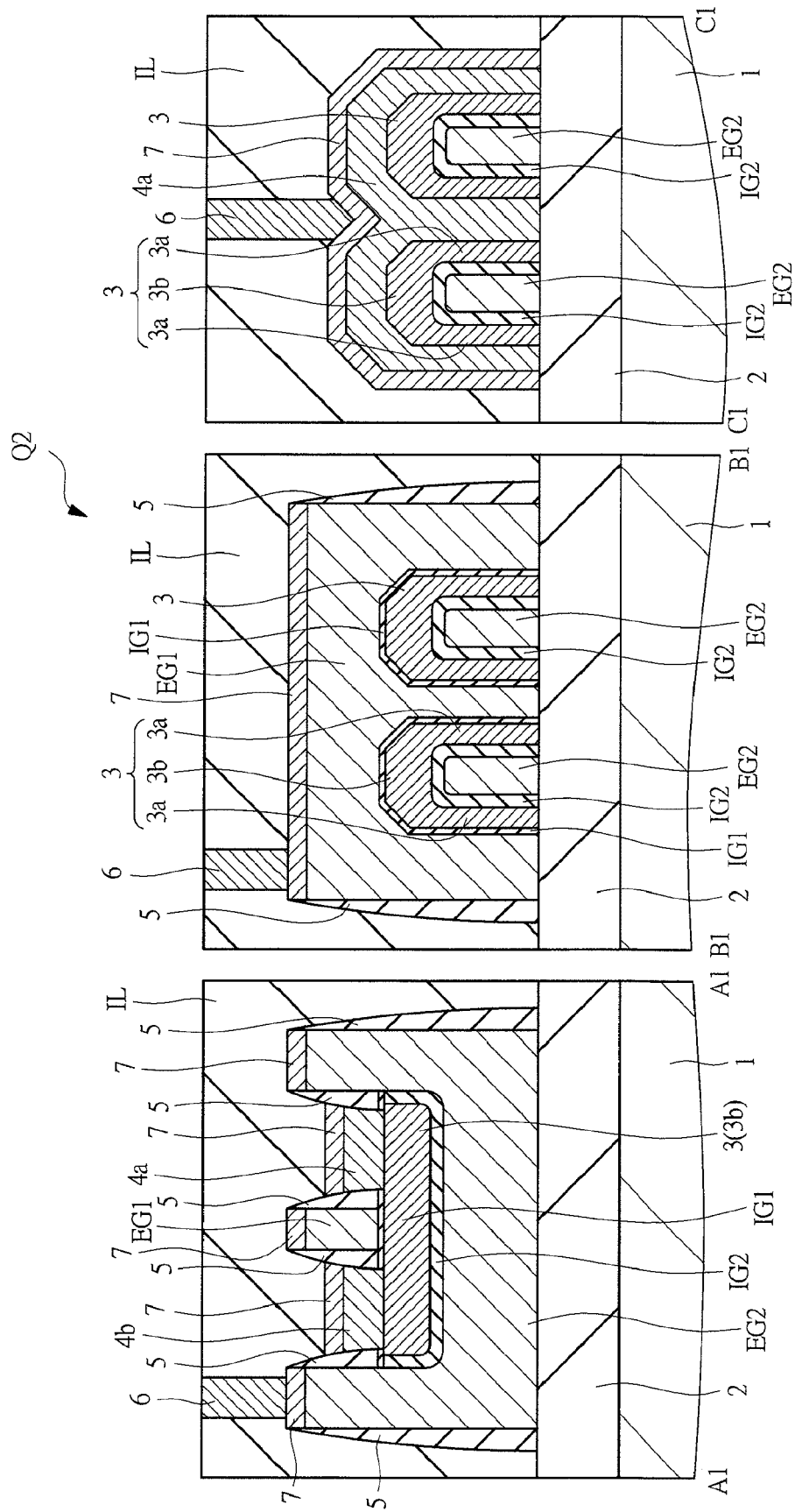
FIG. 18 is cross-sectional views of principal parts of another semiconductor device according to the first embodiment of the present invention which are viewed in each arrow direction along lines A1-A1, B1-B1, and C1-C1 in FIG. 1.

Next, another structure of the FINFET which the semiconductor device according to the first embodiment has is described with reference to FIG. 18. FIG. 18 illustrates cross-sectional views of principal parts of another FINFET Q2 according to the first embodiment. The illustrated regions correspond to those in FIG. 2, and a plan view of the principal parts is the same as that of FIG. 1. The FINFET Q2 illustrated in FIG. 18 is constitutionally the same as the FINFET Q1 described with reference to FIGS. 1 and 2 except for the following points, and effects obtained by having each component are also the same as the above-described effects.

In a thickness of the arch-shaped channel layer 3 of another FINFET Q2 according to the first embodiment, the channel crosspiece portion 3b is thicker than the channel sidewall portion 3a. Effects obtained by forming such a structure are described below.

Generally, mobility of carriers drifting in a semiconductor changes depending on a drift direction in a crystal orientation of the semiconductor. In a conventional planar-type MISFET, the carriers drift in a planar channel region from a source toward a drain, and therefore, the carriers are transported in the same direction of the crystal orientation. On the other hand, in a FINFET, the carriers drift in a three-dimensional channel region, and therefore, the carriers are possibly transported in a different direction of the crystal orientation depending on their portions. Also in the MISFETs Q1 and Q2 according to the first embodiment, among carriers drifting in the arch-shaped channel layer 3 from the source layer 4a toward the drain layer 4b, carriers transported in the channel sidewall portion 3a and carriers transported in the channel crosspiece portion 3b drift in a different direction of the crystal orientation from each other even in the same monocrystalline silicon. These carriers have a different mobility from each other, and therefore, this becomes one cause of characteristic variation.

Accordingly, in the FINFET Q2 described with reference to FIG. 18 in the first embodiment, the channel crosspiece portion 3b whose crystal orientation is different from that of the channel sidewall portion 3a is thickened, so that controllability of the channel crosspiece portion 3b to the gate can be reduced. In this manner, the influence of the carriers drifting in the channel crosspiece portion 3b is decreased to the electric characteristics of the FINFET Q2, so that characteristic uniformity can be improved. As a result, characteristics of the semiconductor device having the FINFET can be further improved.

Hereinafter, steps of forming the FINFET Q2 having such a structure are described. Other steps than those steps described below are the same as the manufacture steps of the FINFET Q1 described with reference to FIGS. 3 to 18, and effects obtained by having each step are also the same as the above-described effects.

Figure 19:
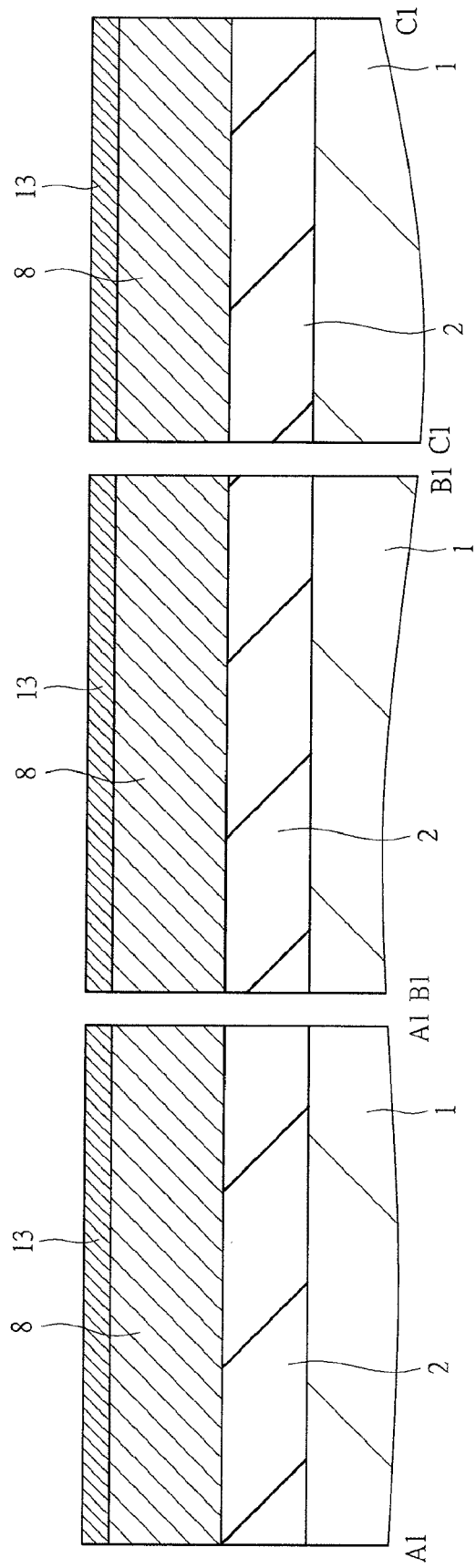
FIG. 19 is cross-sectional views of principal parts in the manufacture step of the another semiconductor device according to the first embodiment of the present invention which are regions corresponding to those in FIG. 18.

First, as illustrated in FIG. 19, there is prepared a substrate in which a second semiconductor layer 13 is formed so as to cover the first semiconductor layer 8 in the SGOI substrate having the silicon substrate 1, the insulating film 2, and the first semiconductor layer 8 made of SiGe as described in FIG. 3. Here, the second semiconductor layer 13 is a semiconductor made of monocrystalline silicon. The monocrystalline silicon is epitaxially grown on the SGOI substrate to form the second semiconductor layer 13, so that the substrate having such a stacked structure can be prepared.

Figure 20:
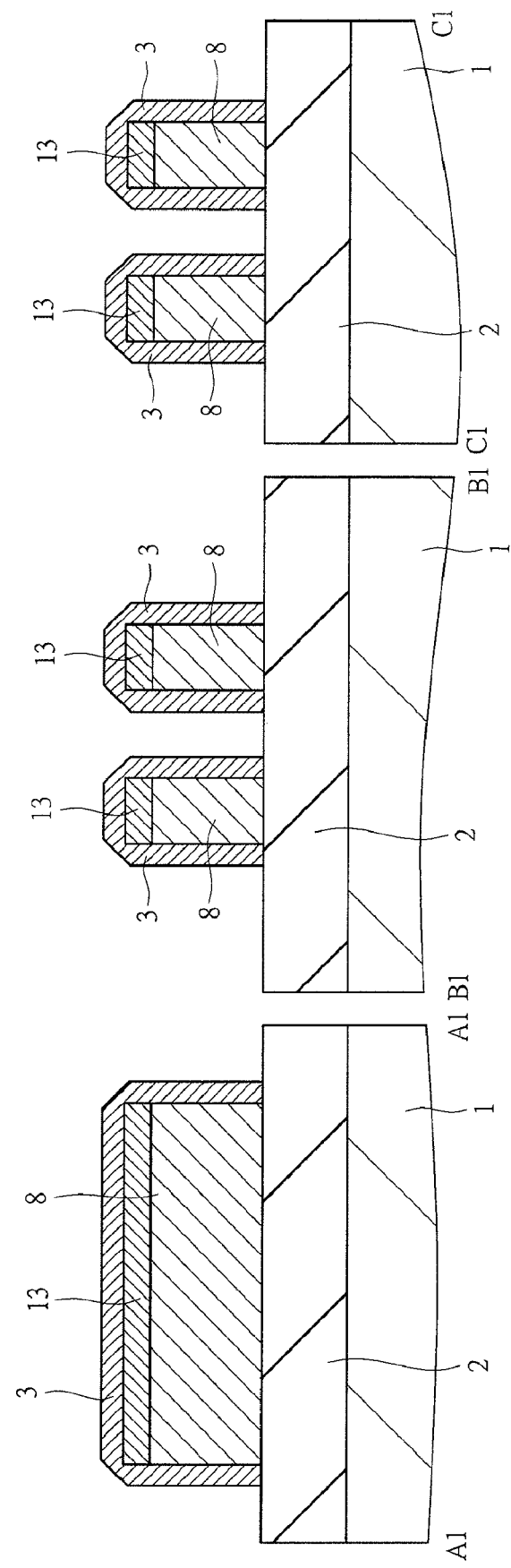
FIG. 20 is cross-sectional views of the principal parts in the manufacture step of the semiconductor device continued from FIG. 19.

Next, as illustrated in FIG. 20, similarly to the step described with reference to FIG. 4, the first semiconductor layer 8 is processed in a fin shape. At this time, the second semiconductor layer 13 on the first semiconductor layer 8 is also subjected to the same process as that of the first semiconductor layer 8. In this manner, the second semiconductor layer 13 is arranged so as to cover a top portion of the fin-shaped first semiconductor layer 8.

Subsequently, similarly to the steps described with reference to FIGS. 5 and 6, the channel layer 3 is formed by an epitaxial growth method so as to cover the first semiconductor layer 8. At this time, the channel layer 3 is formed so as to cover even the second semiconductor layer 13 covering the top portion of the first semiconductor layer 8. Since the second semiconductor layer 13 is made of monocrystalline silicon, the channel layer 3 similarly made of monocrystalline silicon can be epitaxially grown. Here, since the second semiconductor layer 13 and the channel layer 3 are made of the same monocrystalline silicon, they are not constitutionally different from each other, and the monocrystalline silicon layer on the top portion of the first semiconductor layer 8 is formed thicker than that on the sidewall portion.

Figure 21:
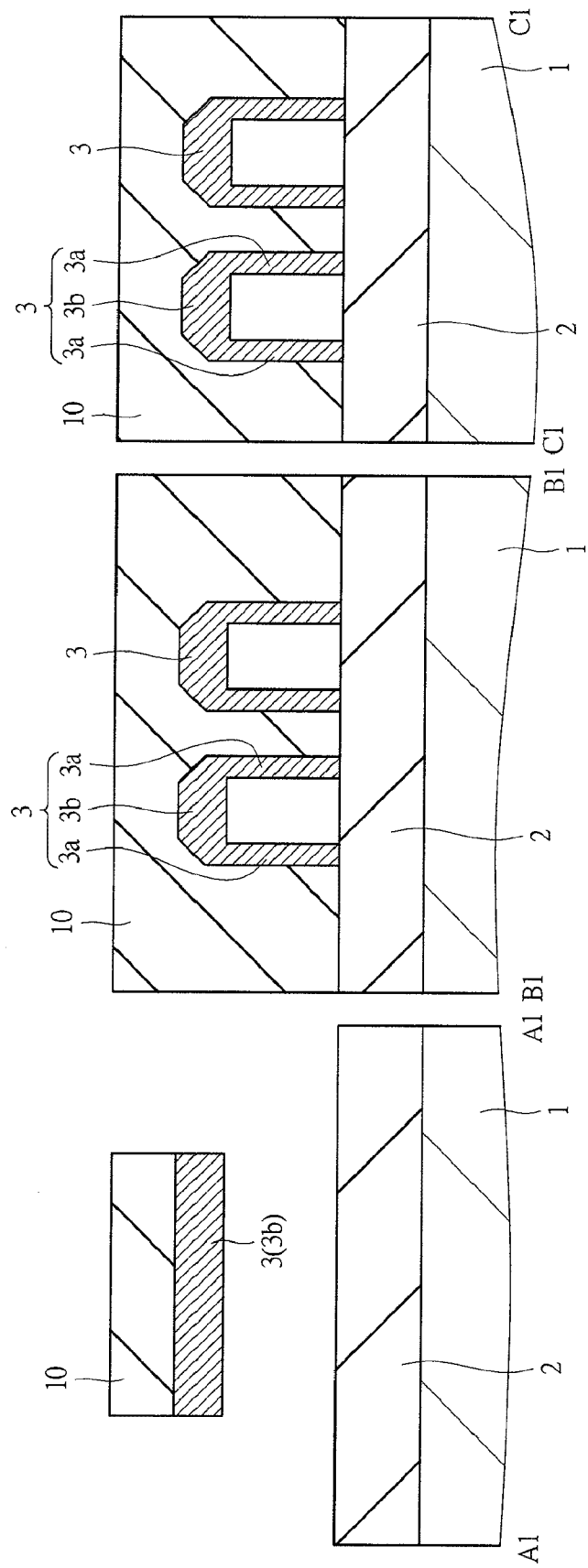
FIG. 21 is cross-sectional views of the principal parts in the manufacture step of the semiconductor device continued from FIG. 20.

Next, as illustrated in FIG. 21, similarly to the steps described with reference to FIGS. 7 and 8, the channel layer 3 is removed on the end portion in the extending direction of the fin-shaped first semiconductor layer 8, so that the sidewall portion of the first semiconductor layer 8 is exposed. And then, similarly to the step described with reference to FIG. 9, the first semiconductor layer 8 made of SiGe is removed by wet etching. In this manner, the arch-shaped channel layer 3 is formed. More particularly, in the steps described later than FIG. 19, the channel crosspiece portion 3b is thicker than the channel sidewall portion 3a by arranging the second semiconductor layer 13 on the top portion of the first semiconductor layer 8.

Figure 22:
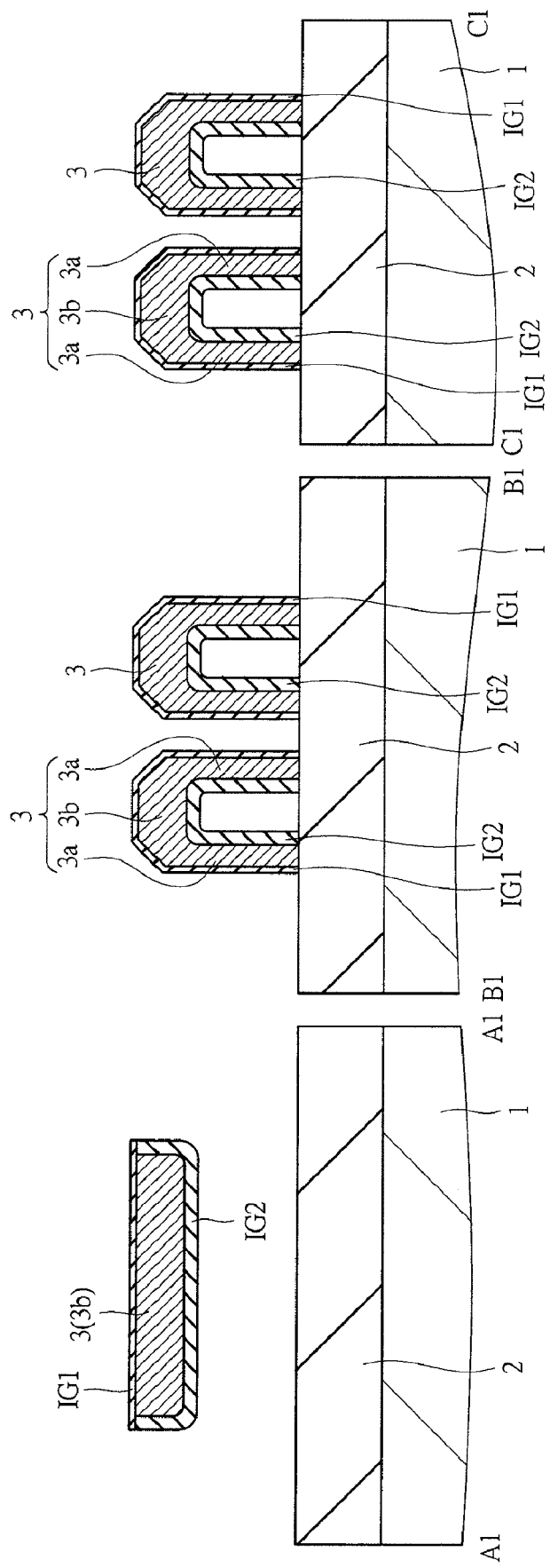
FIG. 22 is cross-sectional views of the principal parts in the manufacture step of the semiconductor device continued from FIG. 21.

Next, as illustrated in FIG. 22, similarly to the step described with reference to FIG. 10, the back-gate insulating film IG2 is formed so as to cover the inside of the arch-shaped channel layer 3. Subsequently, similarly to the step described with reference to FIG. 11, the front-gate insulating film IG1 is formed so as to cover the outside of the arch-shaped channel layer 3.

Figure 23:
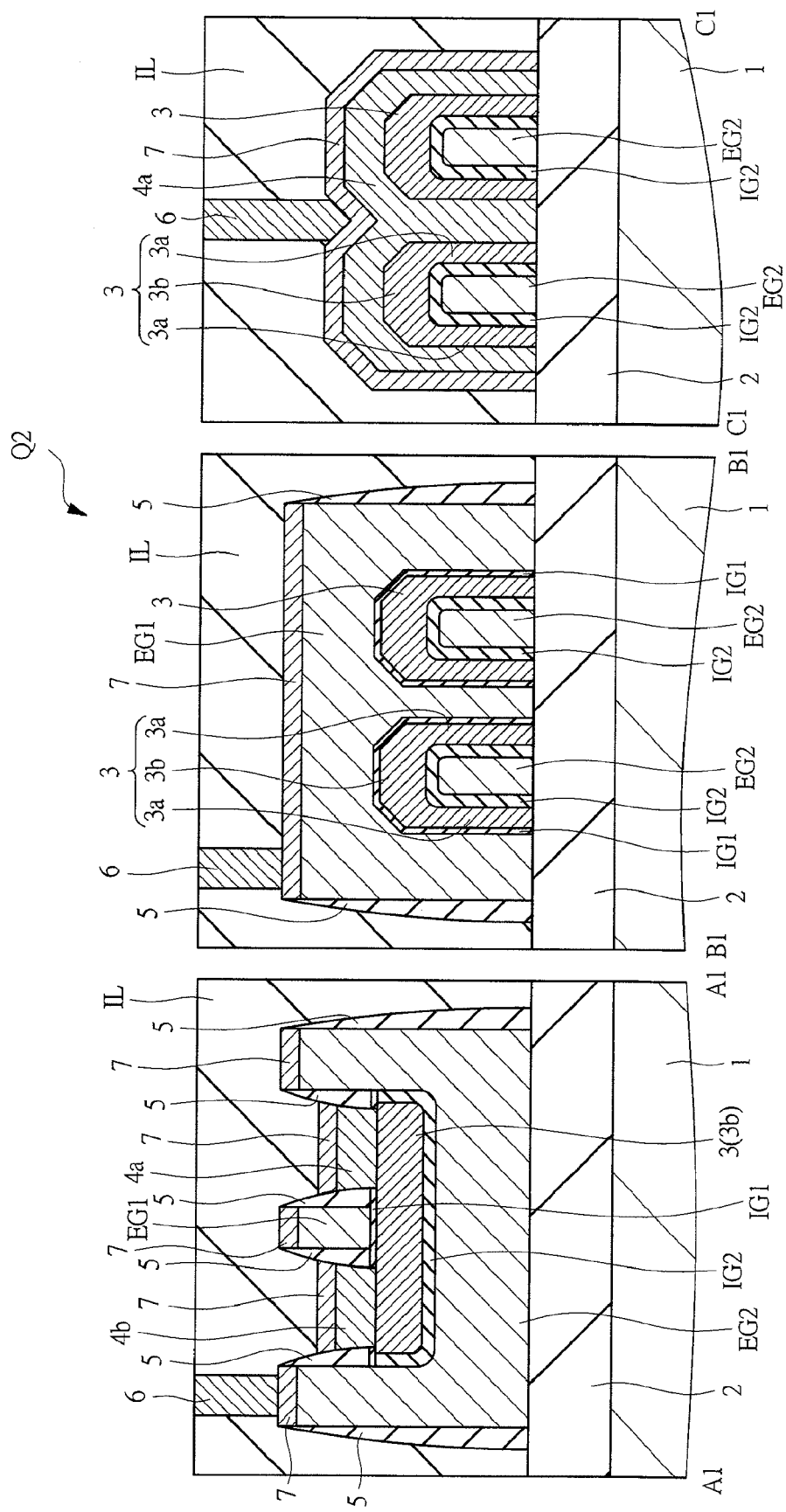
FIG. 23 is cross-sectional views of the principal parts in the manufacture step of the semiconductor device continued from FIG. 22.

Next, as illustrated in FIG. 23, similarly to the steps described with reference to FIGS. 12 and 13, there are formed the front gate electrode EG1, the back gate electrode EG2, the source layer 4a, the drain layer 4b, the metal silicide layer 7, the interlayer insulating film IL, the contact plug 6, and others. As described above, the FINFET Q2 having the channel layer 3 having the structure causing effects described with reference to FIG. 18 can be formed.

Second Embodiment

Figure 24:
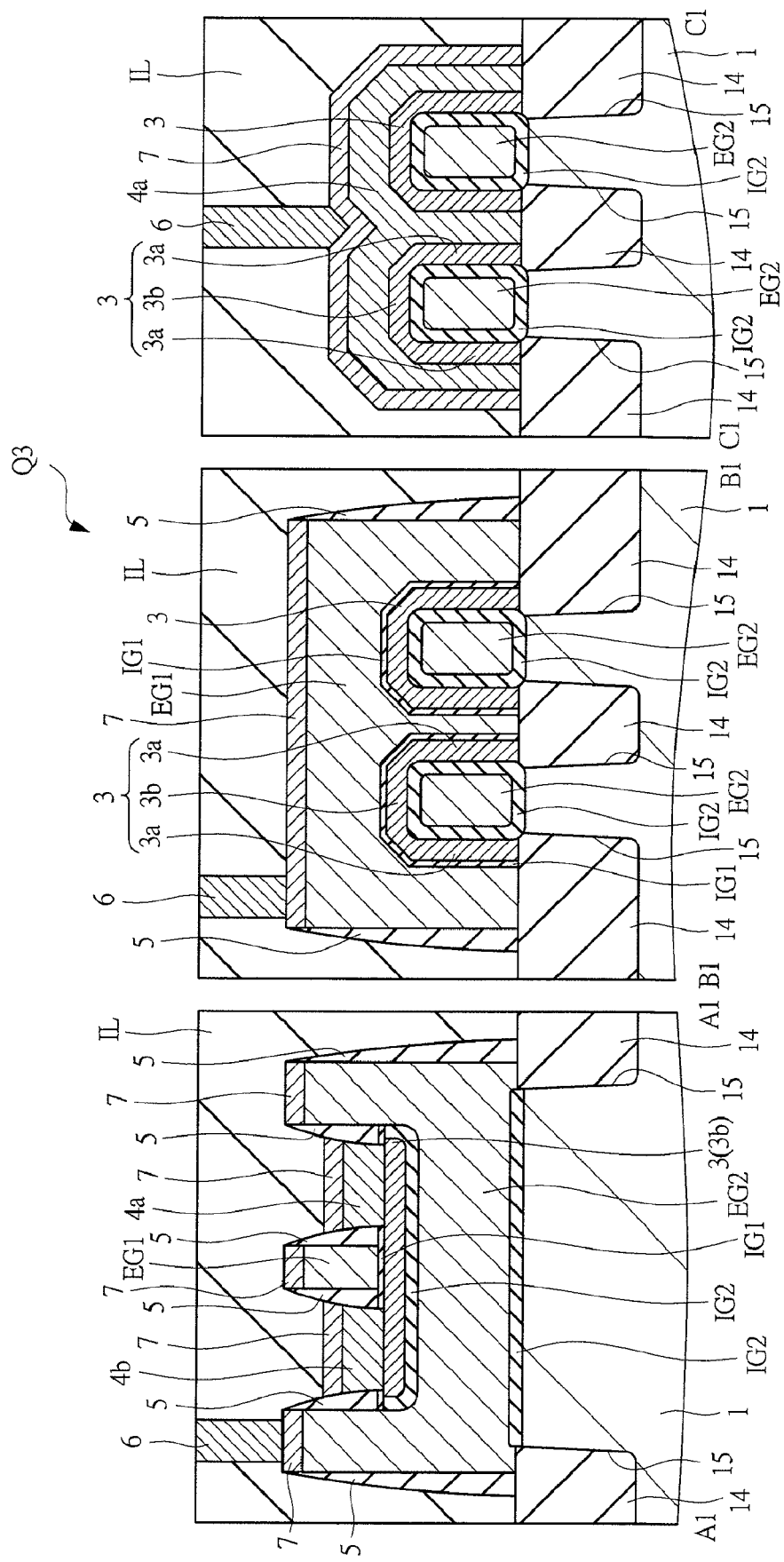
FIG. 24 is cross-sectional views of principal parts of a semiconductor device according to a second embodiment of the present invention which are viewed in each arrow direction along lines A1-A1, B1-B1, and C1-C1 in FIG. 1.

FIG. 24 illustrates cross-sectional views of principal parts of a FINFET Q3 which a semiconductor device according to a second embodiment has. The illustrated regions correspond to those in FIG. 2 in the FINFET Q1 according to the first embodiment, and their plan views of principal parts are the same as those in FIG. 1, and therefore, their plan views are not illustrated here. The FINFET Q3 illustrated in FIG. 24 is constitutionally the same as the FINFET Q1 described with reference to FIGS. 1 and 2 except for the following points, and effects obtained by having each component are also the same as the above-described effects.

The FINFET Q3 which the semiconductor device according to the second embodiment has is formed on a silicon substrate 1. And, a back-gate insulating film IG2 is formed between the silicon substrate 1 and a back gate electrode EG2, so that they are insulated from each other. As described in FIGS. 1 and 2, the back-gate insulating film IG2 is an insulating film mainly made of silicon oxide, and is also arranged between the arch-shaped channel layer 3 and the back gate electrode EG2 to be a member for insulating them from each other. And, the FINFET Q3 according to the second embodiment has a structure in which the back-gate insulating film IG2 is integrally formed from a portion between the channel layer 3 and the back gate electrode EG2 over a portion between the silicon substrate 1 and the back gate electrode EG2. In this manner, the silicon substrate 1 and the back gate electrode EG2 are insulated from each other by the back-gate insulating film IG2.

Also, a STI isolating portion 14 having a shallow trench isolation (STI) structure insulates between the silicon substrate 1 and the back gate electrode EG2 on a portion not insulated by the back-gate insulating film IG2, the channel layer 3 of the conductor forming the FINFET Q3 according to the second embodiment, the front gate electrode EG1, the source layer 4a, the drain layer 4b, the metal silicide layer 7, and others. The STI isolating portion 14 is an isolating portion having a shape in which an insulating film mainly made of silicon oxide is buried inside a shallow trench portion 15 formed on the main surface of the silicon substrate 1.

As described above, the FINFET Q3 according to the second embodiment has the same structure in which the channel layer 3 has the arch shape, the front gate electrode EG1 is provided its outside, the back gate electrode EG2 is provided its inside, and others, as those of the FINFETs Q1 and Q2 according to the first embodiment. Therefore, the FINFET Q3 according to the second embodiment also has the effect capable of further improving characteristics of the semiconductor device having the FINFET similarly to the FINFETs Q1 and Q2 according to the first embodiment.

Also, in the semiconductor device according to the first embodiment, the structure in which the FINFET Q1 or Q2 is formed on the SGOI substrate or SOI substrate is described. On the other hand, in the semiconductor device according to the second embodiment, the insulating isolation structure as described above is used, so that the FINFET Q3 can be arranged directly on the silicon substrate 1 by using. That is, the effective FINFET as described above can be formed on not only the SGOI substrate or SOI substrate but also the silicon substrate 1. The silicon substrate 1 can be inexpensively prepared compared with the SGOI substrate or SOI substrate having the buried insulating layer. Therefore, by the FINFET Q3 according to the second embodiment, a manufacture cost can be suppressed, and productivity can be improved. On the other hand, the insulating layer is fully provided below the FINFET in the SGOI substrate or SOI substrate, and therefore, a concern such as a current leakage to the substrate is unnecessary, and higher performance can be achieved. From this viewpoint, the FINFETs Q1 and Q2 having the structure as the first embodiment are more preferable.

Next, a method of manufacturing the semiconductor device having the FINFET Q2 according to the second embodiment is described with reference to FIGS. 25 to 29. FIGS. 25 to 29 are cross-sectional views of principal parts in the manufacture step for the regions corresponding to FIG. 24. Note that, among members formed by the steps described below, a member with the same symbol as that described with reference to the above-described FIG. 24 has the same characteristics such as a thickness and a material as well unless otherwise stated. Also, steps except for those described below are the same as the steps in the method of manufacturing the semiconductor device described with reference to FIGS. 3 to 17, and effects obtained by having the same steps are also the same.

Figure 25:
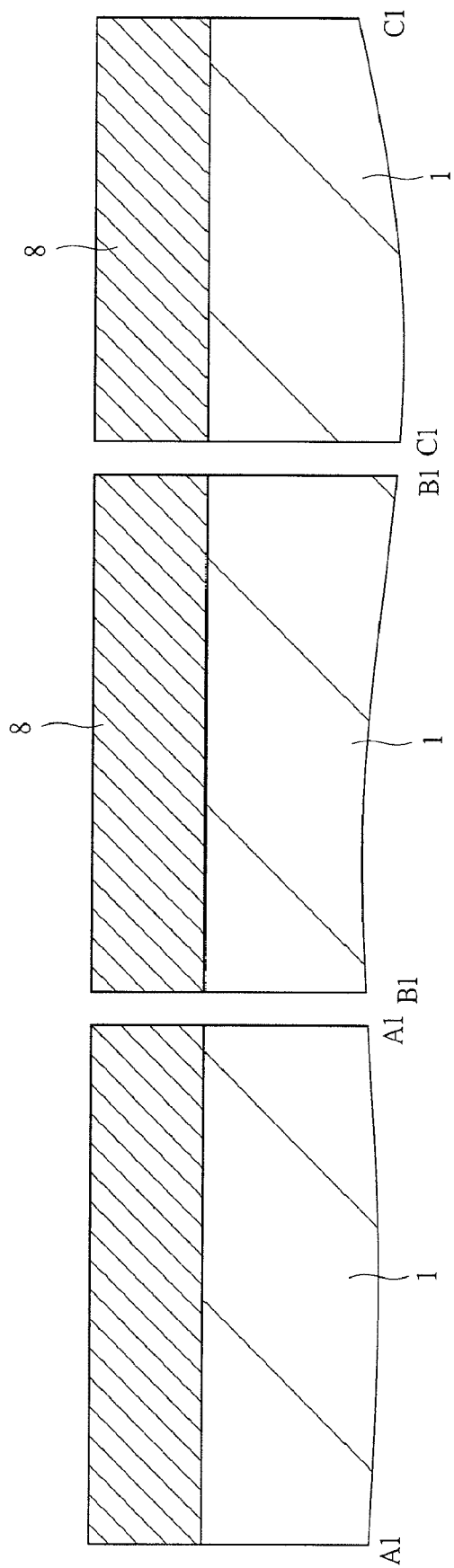
FIG. 25 is cross-sectional views of principal parts in a manufacture step of the semiconductor device according to the second embodiment of the present invention which are regions corresponding to those in FIG. 24.

First, as illustrated in FIG. 25, the first semiconductor layer 8 mainly made of SiGe is formed on the silicon substrate 1 by an epitaxial growth method or others. In the manufacture method according to the second embodiment, the first semiconductor layer 8 can be arranged on the monocrystalline silicon substrate 1 by the epitaxial growth method.

Figure 26:
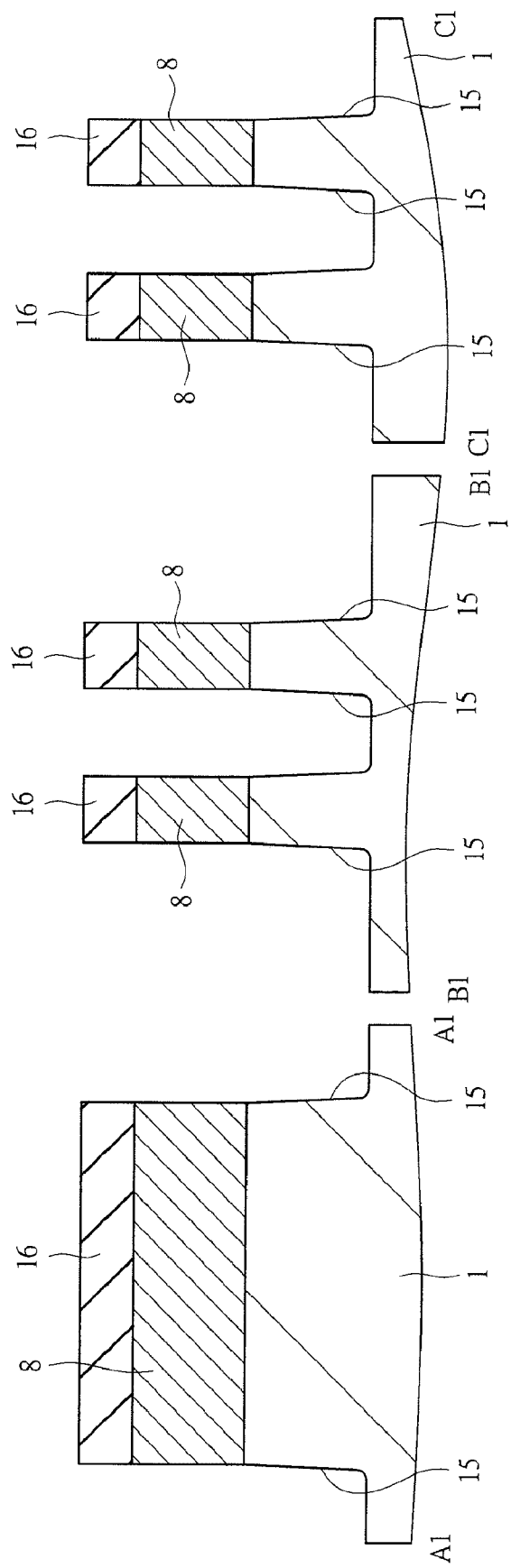
FIG. 26 is cross-sectional views of the principal parts in the manufacture step of the semiconductor device continued from FIG. 25.

Next, as illustrated in FIG. 26, a cap nitride film 16 is formed by a CVD method. And then, the cap nitride film 16 is patterned similarly to the patterning of the cap oxide film 9 in FIG. 4. Subsequently, the first semiconductor layer 8 is patterned in the fin shape with using the cap nitride film 16 as an etching mask. And, in the manufacture method according to the second embodiment, further, the silicon substrate 1 is subjected to dry etching with using the cap oxide film 9 as an etching mask. In this manner, there is formed a trench portion 15 on the main surface of the silicon substrate 1 on the side-below portion of the fin-shaped first semiconductor layer 8.

Figure 27:
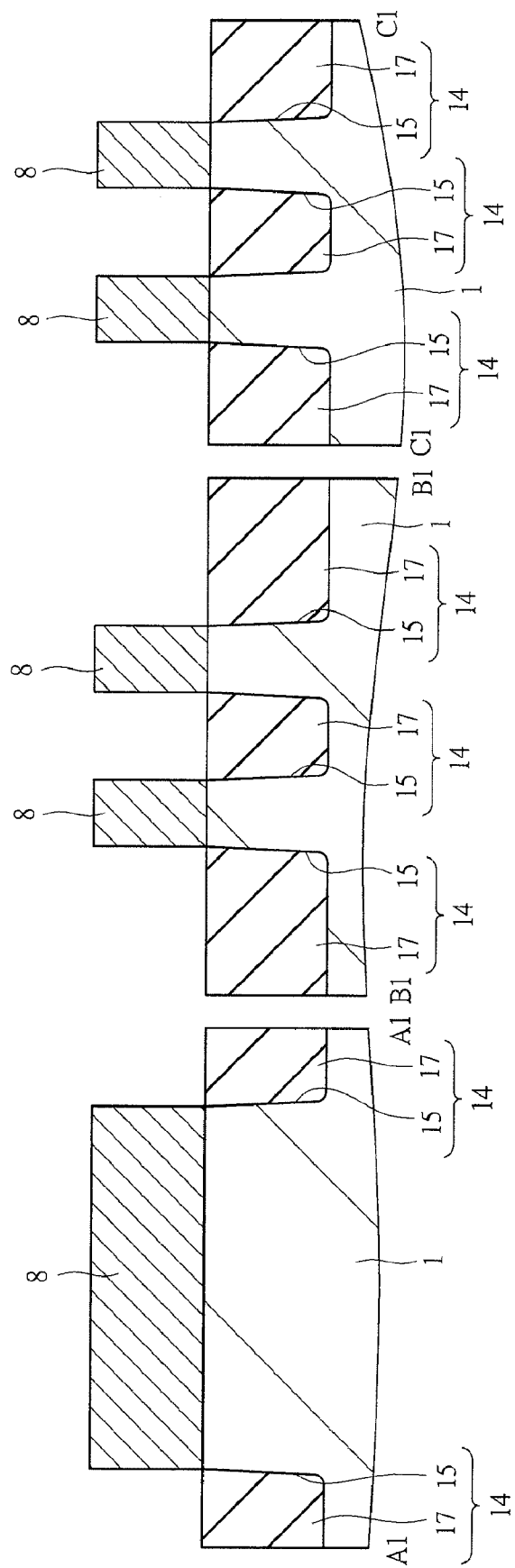
FIG. 27 is cross-sectional views of the principal parts in the manufacture step of the semiconductor device continued from FIG. 26.

Next, as illustrated in FIG. 27, a silicon oxide film 17 is deposited so as to cover the main surface of the silicon substrate 1 including the trench portion 15. Subsequently, the silicon oxide film 17 is flattened by a CMP method or others. And then, the cap nitride film 16 is removed, and a height of the silicon oxide film 17 is adjusted by wet etching or others, so that there is formed the STI isolating portion 14 having the shape in which the trench portion 15 is buried by the silicon oxide film 17.

At this time, a position of the boundary portion between the fin-shaped first semiconductor layer 8 and the silicon substrate 1 may not be matched with a height of a top surface of the STI isolating portion 14. However, if there is a possibility that the channel layer 3 formed in a later step and the silicon substrate 1 are adjacent to each other, it is desirable to set an impurity concentration high by ion implantation to the silicon substrate 1.

Figure 28:
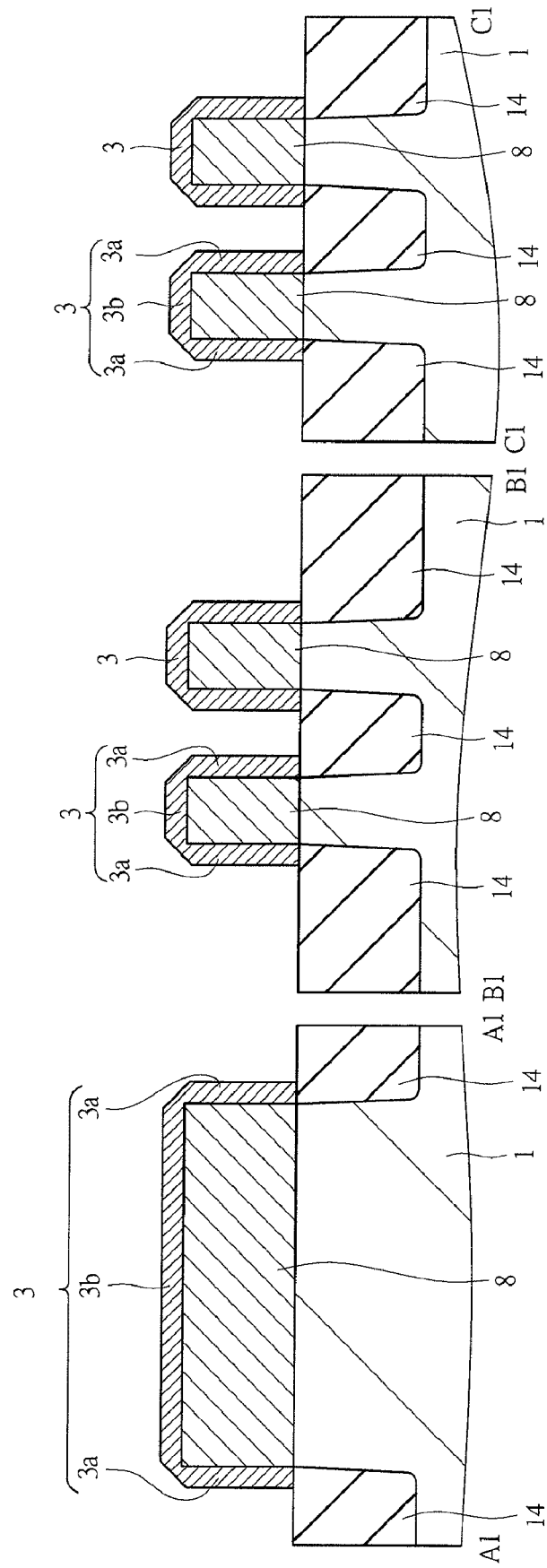
FIG. 28 is cross-sectional views of the principal parts in the manufacture step of the semiconductor device continued from FIG. 27.

Next, as illustrated in FIG. 28, similarly to the step described with reference to FIG. 6, the channel layer 3 made of monocrystalline silicon is formed so as to cover the fin-shaped first semiconductor layer 8. Here, since the STI isolating portion 14 is formed in the silicon substrate 1 on the side-below portion of the fin-shaped first semiconductor layer 8, the monocrystalline silicon is not crystal-grown over the silicon substrate 1.

Figure 29:
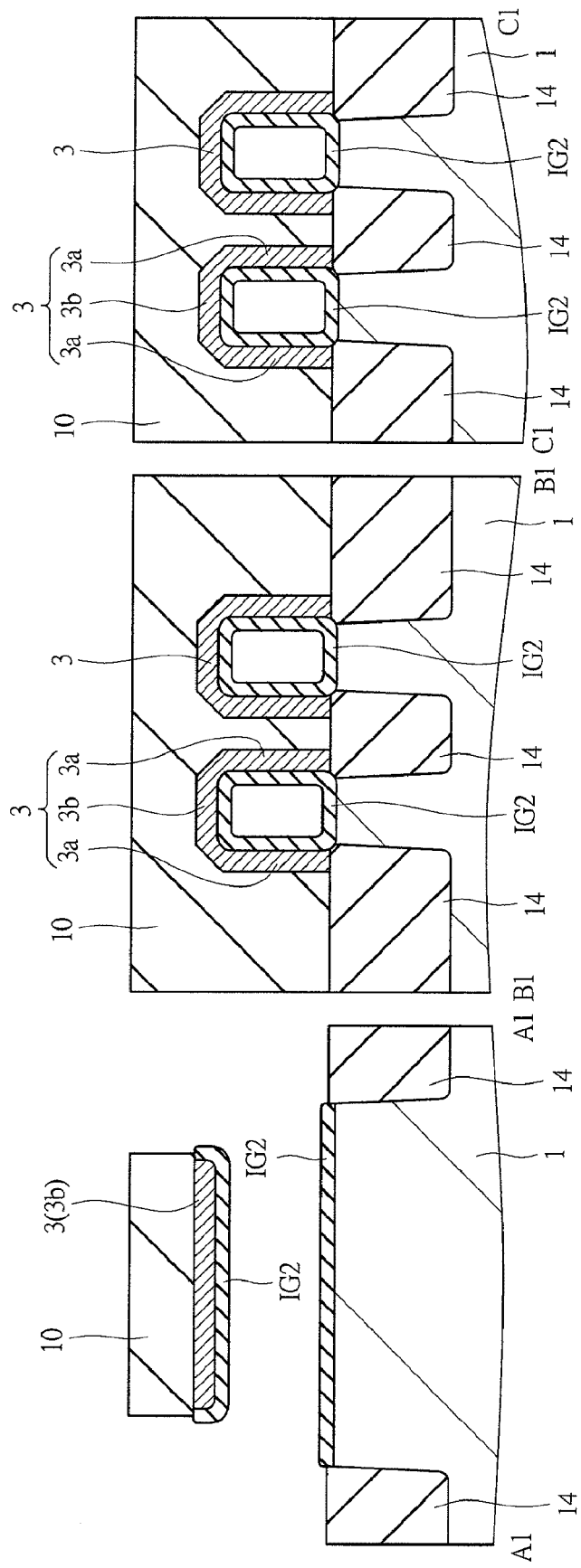
FIG. 29 is cross-sectional views of the principal parts in the manufacture step of the semiconductor device continued from FIG. 28.

Next, as illustrated in FIG. 29, similarly to the steps described with reference to FIGS. 7 to 9, the first semiconductor layer 8 is removed, so that the channel layer 3 is processed in the arch shape. And then, similarly to the step described with reference to FIG. 10, the back-gate insulating film IG2 is formed by a thermal oxidation method. Here, in the manufacture method according to the second embodiment, after removing the first semiconductor layer 8 in the previous step, the silicon substrate 1 is exposed below the arch-shaped channel layer 3. Therefore, when this state is subjected to the thermal oxidation, the back-gate insulating film IG2 is also formed on the exposed surface of the silicon substrate 1. In this manner, as described with reference to FIG. 24, it is possible to achieve a structure in which the back-gate insulating film IG2 is also formed between the back gate electrode EG2 and the silicon substrate 1.

In a subsequent step, by the same steps in FIGS. 11 to 17, the FINFET Q3 according to the second embodiment illustrated in FIG. 24 is completed. As described above, it is possible to form the semiconductor device having the FINFET Q3 according to the second embodiment having the above-described effects.

Third Embodiment

Figure 30:
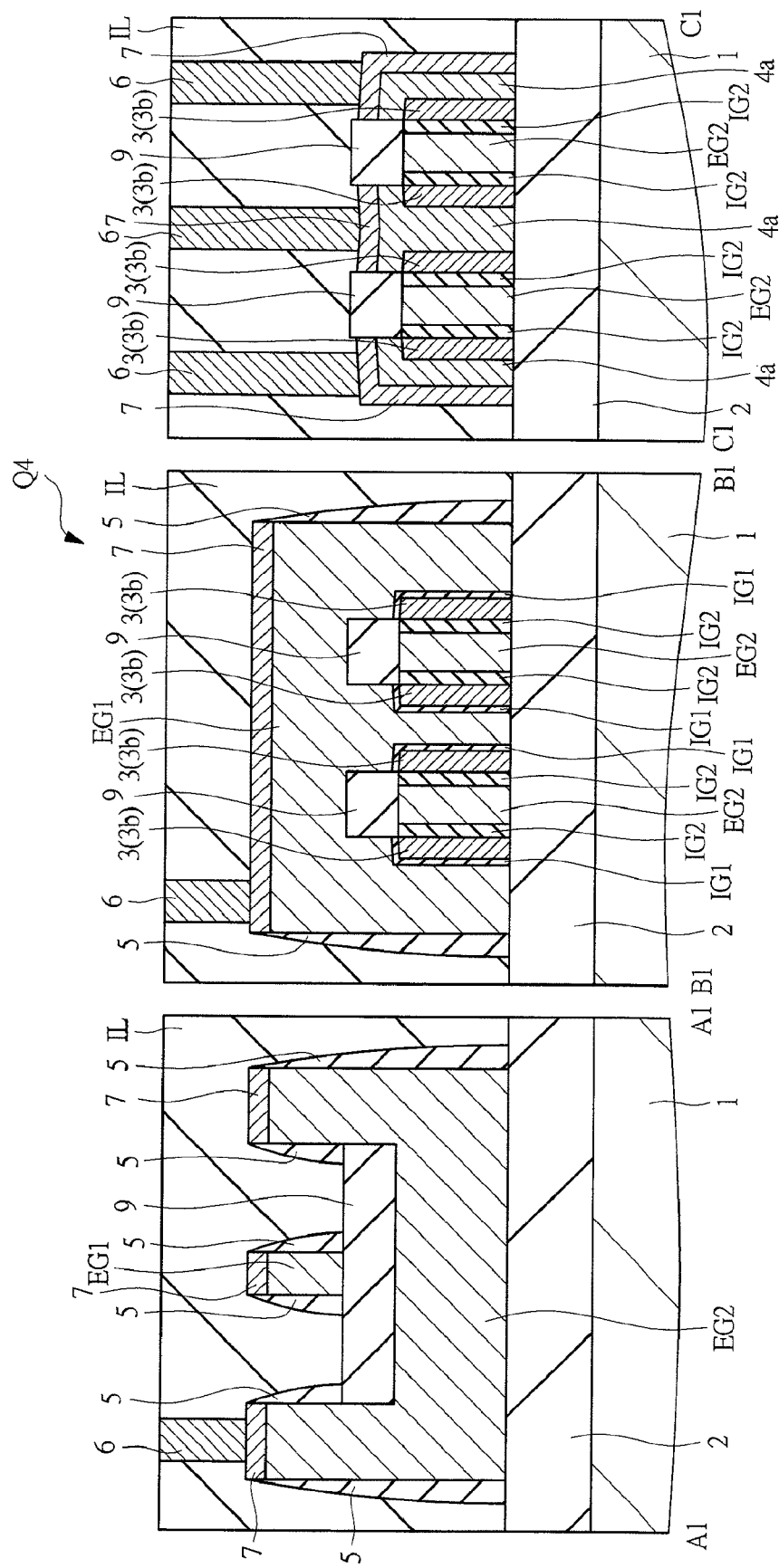
FIG. 30 is cross-sectional views of principal parts of a semiconductor device according to a third embodiment of the present invention which are viewed in each arrow direction along lines A1-A1, B1-B1, and C1-C1 in FIG. 1.

FIG. 30 illustrates cross-sectional views of principal parts of a FINFET Q4 which a semiconductor device according to a third embodiment has. The illustrated regions correspond to those in FIG. 2 in the FINFET Q1 according to the first embodiment, and their plan views of principal parts are the same as those in FIG. 1, and therefore, their plan views are not illustrated here. The FINFET Q4 illustrated in FIG. 30 is constitutionally the same as the FINFET Q1 described with reference to FIGS. 1 and 2 except for the following points, and effects obtained by having each component are also the same as the above-described effects.

A channel layer 3 of the FINFET Q4 which the semiconductor device according to the third embodiment has is arranged in a parallel-plane shape facing each other. This structure can be also described to have two channel sidewall portions 3a arranged in the direction crossing the main surface of the silicon substrate 1 and not to have the channel crosspiece portion 3b arranged in the direction along the main surface of the silicon substrate 1 in the arch-shaped channel layer 3 in the FINFET Q1 according to the first embodiment.

The front-gate insulating film IG1 is formed so as to cover a part of outsides not facing each other in the parallel-plane-shaped channel layer 3. And, the front gate electrode EG1 is formed so as to cover the outsides of the channel layer 3 through the front-gate insulating film IG1. Also, the back-gate insulating film IG2 is formed so as to cover the insides facing each other in the parallel-plane-shaped channel layer 3. And, the back gate electrode EG2 is formed so as to be buried inside the channel layer 3 facing each other through the back-gate insulating film IG2. Also, in order not to electrically connect between the front gate electrode EG1 and the back gate electrode EG2 in a top portion of the parallel-plane-shaped channel layer 3, the cap oxide film 9 is arranged therebetween.

Further, when it is difficult that the source layer 4a or drain layer 4b is integrally connected on the top portion of the channel layer 3 because of arranging the cap oxide film 9, it is required to connect the contact plug 6 with each source layer 4a or drain layer 4b.

As described above, in the FINFET Q4 according to the third embodiment, the channel layer 3 has the parallel-plane shape, the front gate electrode EG1 is arranged outside the facing planes, and the back gate electrode EG2 is arranged inside the facing planes. This structure, in spite of not having the arch shape, has the same basic structure as those of the FINFETs Q1 and Q2 according to the first embodiment in a point of controlling electric-field influence to the channel layer 3 by two gate electrodes without significant loss of an area where the inversion layer is formed in the channel layer 3. Therefore, similarly to the FINFETs Q1 and Q2 according to the first embodiment, there is the same effect capable of further improving characteristics of the semiconductor device having the FINFET.

Also, as described above, for example, in the arch-shaped channel layer 3 in the FINFET Q1 according to the first embodiment, the channel sidewall portion 3a and the channel crosspiece portion 3b are different from each other in the direction of the crystal orientation as the carrier-drifting direction, and this difference may be one cause of the characteristic variation. Therefore, the channel layer 3 of the FINFET Q4 according to the third embodiment is formed of the channel sidewall portions 3a each having the same crystal orientation as the other, and do not have the channel crosspiece portion 3b having the different crystal orientation. Therefore, the FINFET characteristics having further excellent uniformity can be achieved. As a result, the characteristics of the semiconductor device having the FINFET can be further improved. However, from a viewpoint of a possibility of increasing a current amount (increasing a driving performance), the structure in which all side surfaces of the arch-shaped channel layer 3 can be used as the channel as the FINFET Q1 according to the first embodiment is more preferable.

Next, a method of manufacturing the semiconductor device having the FINFET Q4 according to the third embodiment is described with reference to FIGS. 31 to 35. FIGS. 31 to 35 are cross-sectional views of principal parts in the manufacture step for the regions corresponding to the above-described FIG. 30. Note that, among members formed by the steps described below, a member with the same symbol as that described with reference to FIG. 30 has the same characteristics such as a thickness and a material as well unless otherwise stated. Also, steps except for those described below are the same as the steps in the method of manufacturing the semiconductor device described with reference to FIGS. 3 to 17, and effects obtained by having the same steps are also the same.

Figure 31:
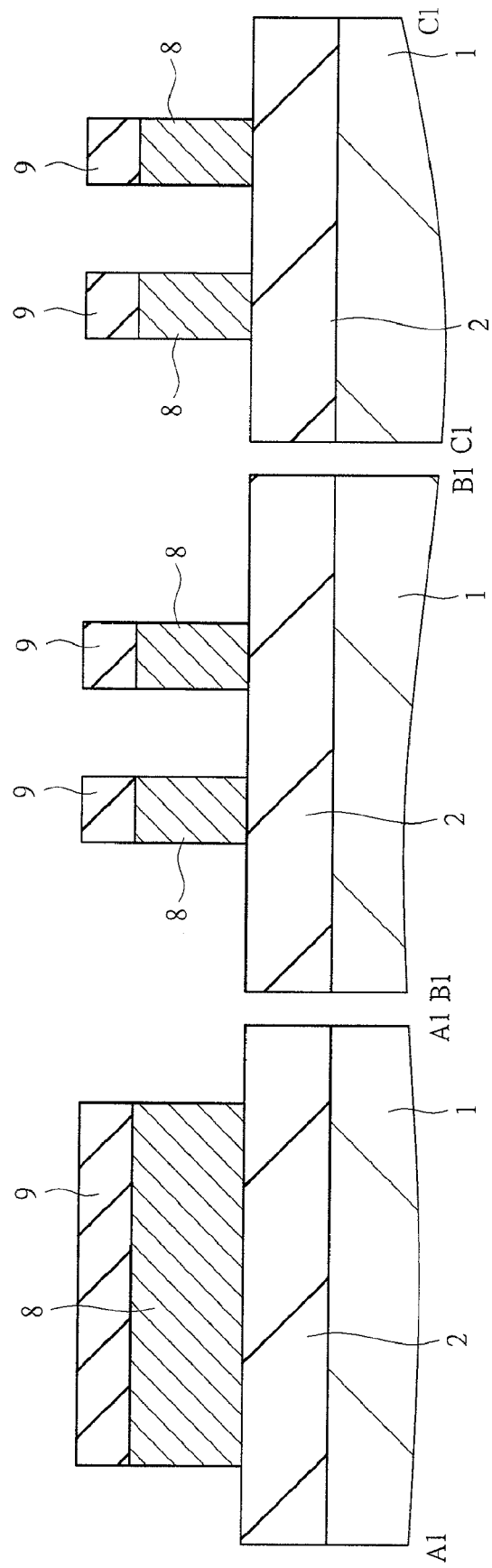
FIG. 31 is cross-sectional views of principal parts in a manufacture step of the semiconductor device according to the third embodiment of the present invention which are regions corresponding to those in FIG. 30.

First, as illustrated in FIG. 31, similarly to the steps described with reference to FIGS. 3 and 4, the first semiconductor layer 8 is subjected to etching with using the patterned cap oxide film 9 as an etching mask. In this manner, the fin-shaped first semiconductor layer 8 whose top surface is covered by the cap oxide film 9 is formed.

Figure 32:
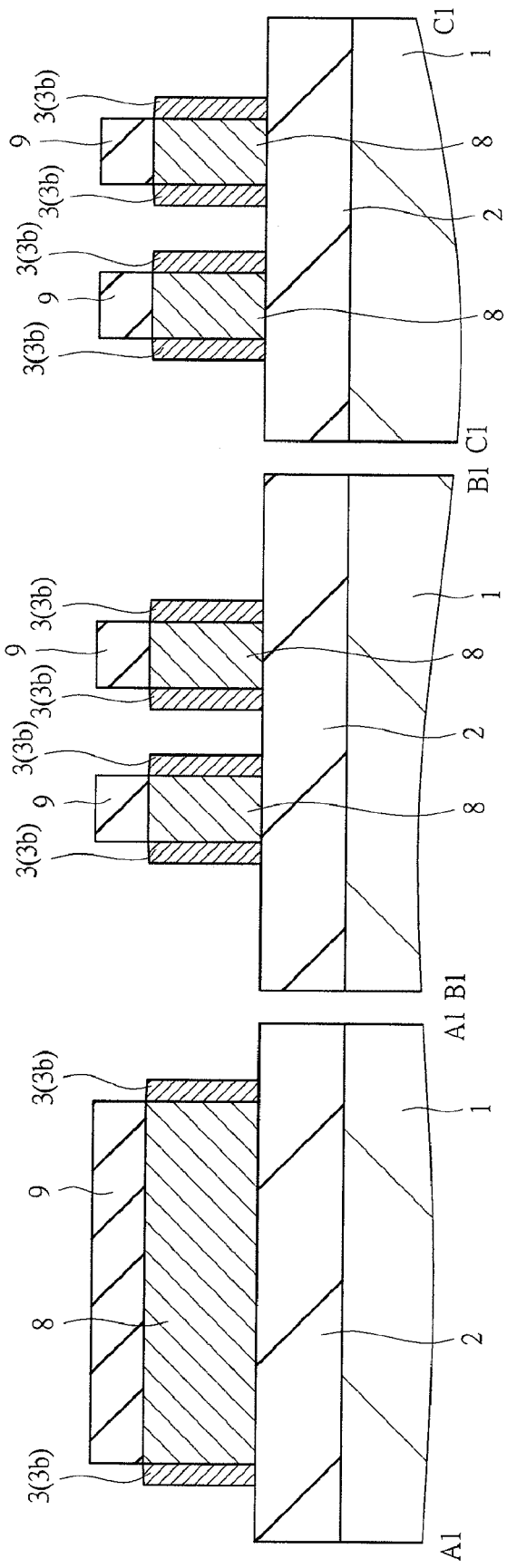
FIG. 32 is cross-sectional views of the principal parts in the manufacture step of the semiconductor device continued from FIG. 31.

Next, as illustrated in FIG. 32, similarly to the steps described with reference to FIGS. 5 and 6, monocrystalline silicon is epitaxially grown on the first semiconductor layer 8, so that the channel layer 3 is formed. Here, in the manufacture method according to the third embodiment, the monocrystalline silicon is epitaxially grown on the first semiconductor layer 8 without removing the cap oxide film 9. That is, the monocrystalline silicon is not epitaxially grown on the top surface of the fin-shaped first semiconductor layer 8 covered by the cap oxide film 9, and therefore, the channel layer 3 is not formed thereon. And, the monocrystalline silicon is epitaxially grown on only the exposed sidewall surface of the first semiconductor layer 8, and therefore, the channel layer 3 is formed thereon. In this manner, the channel layer 3 formed of only the channel sidewall portion 3a is formed.

Figure 33:
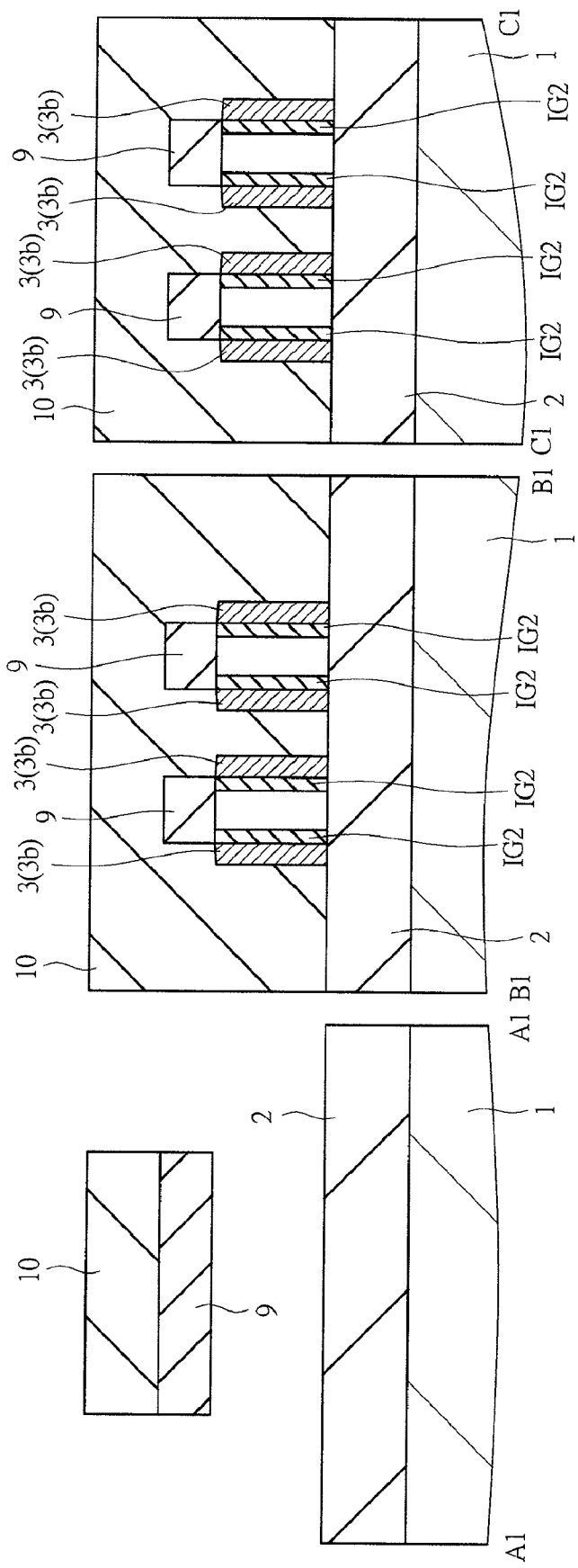
FIG. 33 is cross-sectional views of the principal parts in the manufacture step of the semiconductor device continued from FIG. 32.

Next, as illustrated in FIG. 33, similarly to the steps described with reference to FIGS. 7 and 9, the first semiconductor layer 8 made of SiGe is subjected to etching with using the patterned cap nitride film 10 as an etching mask, so that the first semiconductor layer 8 is selectively removed. And then, similarly to the step described with reference to FIG. 10, the back-gate insulating film IG2 is formed on the channel layer 3 by the etching. At this time, in the manufacture method according to the third embodiment, the outsides where the parallel-plan-shaped channel layers 3 are not faced to each other are covered by the cap nitride film 10, and therefore, only the insides where they are faced to each other are oxidized, so that the back-gate insulating film IG2 is formed on the insides.

Figure 34:
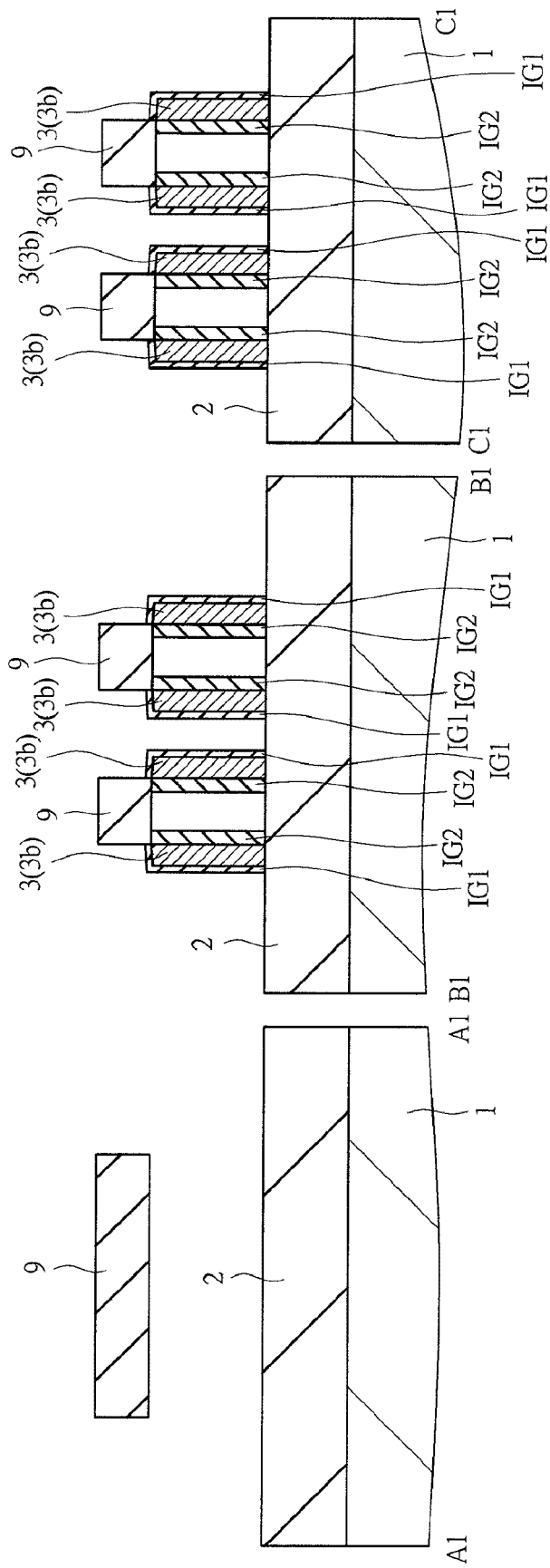
FIG. 34 is cross-sectional views of the principal parts in the manufacture step of the semiconductor device continued from FIG. 33.

Next, as illustrated in FIG. 34, similarly to the step described with reference to FIG. 11, the front-gate insulating film IG1 is formed on the channel layer 3 by the thermal oxidation after removing the cap nitride film 10. At this time, in the manufacture method according to the third embodiment, both side surfaces of the insides where the parallel-plan-shaped channel layers 3 are faced to each other and the outsides opposite to the insides are oxidized.

Figure 35:
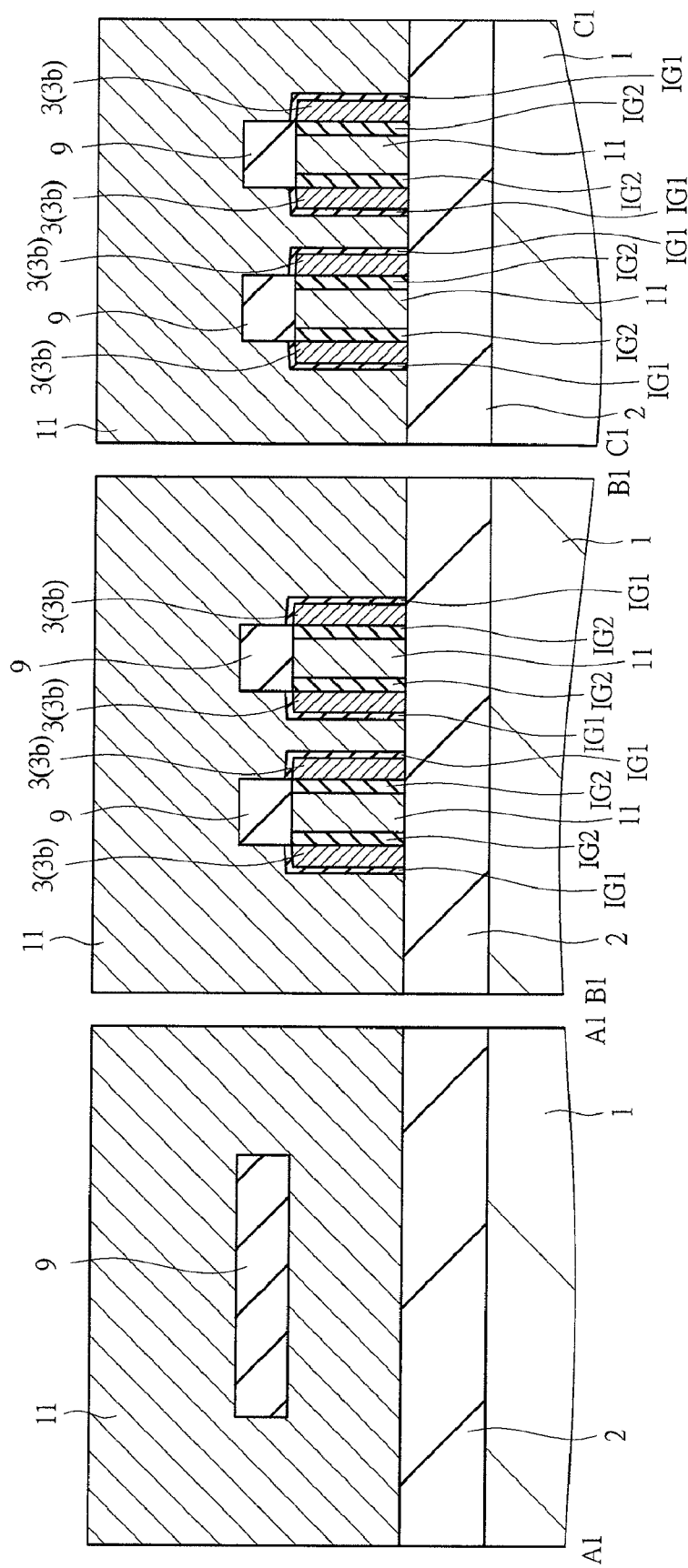
FIG. 35 is cross-sectional views of the principal parts in the manufacture step of the semiconductor device continued from FIG. 34.

Next, as illustrated in FIG. 35, similarly to the step described with reference to FIG. 12, the gate conductive film 11 is formed. At this time, in the manufacture method according to the third embodiment, the gate conductive film 11 is formed so as to be buried inside a region surrounded by the cap oxide film 9 and the parallel-plan-shaped channel layers 3.

In a subsequent step, by the same steps from FIG. 13 to FIG. 17, the FINFET Q4 according to the third embodiment illustrated in FIG. 30 is completed. In the semiconductor device according to the third embodiment having the FINFET Q4 having the parallel-plan-shaped channel layers 3 formed as described above, there is the effect capable of further improving characteristics as described above. However, from a viewpoint of further improving the productivity by reducing the number of steps for forming the channel layers 3 in the parallel-plan shape, the method of manufacturing the semiconductor device according to the first embodiment having the FINFET Q1 having the arch-shaped channel layer 3 is more preferable.

In the foregoing, the invention made by the inventors has been concretely described based on the embodiments. However, it is needless to say that the present invention is not limited to the foregoing embodiments and various modifications and alterations can be made within the scope of the present invention.

The present invention can be used for a semiconductor device having a FINFET.

What is claimed is:

1. A semiconductor device having a FINFET formed on a semiconductor substrate, the FINFET comprising:
a channel layer arranged in an arch shape on the semiconductor substrate and formed of a semiconductor mainly made of monocrystalline silicon;
a first gate insulating film formed so as to cover a part of an outside of the channel layer;
a first gate electrode formed so as to cover the channel layer through the first gate insulating film;
a second gate insulating film formed so as to cover an inside of the channel layer; and
a second gate electrode formed so as to be buried inside the channel layer through the second gate insulating film, wherein
the channel layer has the arch shape having: a sidewall portion arranged in a direction crossing a main surface of the semiconductor substrate; and a crosspiece portion arranged in a direction along the main surface so as to connect between tops of the two sidewall portions, and
the second gate electrode arranged inside the channel layer having the arch shape is arranged so as to pass through the first gate electrode.

2. The semiconductor device according to claim 1, wherein,
when the main surface of the semiconductor substrate is flatly viewed, the first gate electrode and the second gate electrode are arranged so as to cross each other.

3. The semiconductor device according to claim 2, the FINFET further comprising:
a source layer and a drain layer formed so as to cover the outside of the arch shape in the channel layer and contact with the channel layer, wherein
the source layer and the drain layer are arranged on side portions of the first gate electrode so as to be insulated from the first gate electrode, and
the second gate electrode is arranged inside the channel layer having the arch shape so as to pass through the source layer and the drain layer.

4. The semiconductor device according to claim 3, wherein the second gate insulating film is thicker than the first gate insulating film.

5. The semiconductor device according to claim 4, wherein,
in the thickness of the channel layer having the arch shape, the crosspiece portion is thicker than the sidewall portion.

6. The semiconductor device according to claim 5, wherein the FINFET is formed on an insulating layer formed on the main surface of the semiconductor substrate in the semiconductor substrate.

7. The semiconductor device according to claim 5, wherein
the second gate insulating film is also arranged between the second gate electrode and the semiconductor substrate,
a STI isolating portion is formed between the semiconductor substrate and the channel layer, the first gate electrode, the source layer, and the drain layer, and
the second gate insulating film or the STI isolating portion insulatingly isolates between the semiconductor substrate and the channel layer, the first gate electrode, the second gate electrode, the source layer, and the drain layer.

8. A method of manufacturing a semiconductor device having a FINFET on a semiconductor substrate comprising the steps for forming the FINFET of:
(a) preparing the semiconductor substrate having a first semiconductor layer made of silicon germanium as a top layer;
(b) processing the first semiconductor layer in a fin shape;

(c) forming a channel layer so as to cover the first semiconductor layer having the fin shape;

(d) removing the first semiconductor layer covered by the channel layer;

(e) forming a first gate insulating film so as to cover a part of an outside of the channel layer;

(f) forming a first gate electrode so as to cover the channel layer through the first gate insulating;

(g) forming a second gate insulating film so as to cover an inside of the channel layer; and (h) forming a second gate electrode so as to be buried inside the channel layer through the second gate insulating, wherein, in the step of (d), the channel layer is processed in an arch shape having: a sidewall portion arranged in a direction crossing a main surface of the semiconductor substrate; and a crosspiece portion arranged in a direction along the main surface so as to connect between tops of the two sidewall portions, and in the steps of (f) to (h), the second gate electrode is formed inside the arch shape in the channel layer so as to pass through the first gate electrode.

9. The method of manufacturing the semiconductor device according to claim 8, wherein, in the step of (c), the channel layer is formed by crystal-growing monocrystalline silicon by an epitaxial growth method so as to cover the first semiconductor layer having the fin shape.

10. The method of manufacturing the semiconductor device according to claim 9, wherein, in the steps of (f) to (h), when the main surface of the semiconductor substrate is flatly viewed, the first gate electrode and the second gate electrode are arranged so as to cross each other.

11. The method of manufacturing the semiconductor device according to claim 10 further comprising the step for forming the FINFET of, after the step of (h):

(i) forming a source layer and a drain layer so as to cover an outside of the arch shape in the channel layer and contact with the channel layer, wherein, in the step of (i), the source layer and the drain layer are arranged on side portions of the first gate electrode so as to be insulated from the first gate electrode, and in the steps of (h) and (i), the second gate electrode is formed inside the channel layer having the arch shape so as to pass through the source layer and the drain layer.

12. The method of manufacturing the semiconductor device according to claim 11, wherein, in the steps of (e) and (g), the first gate insulating film and the second gate insulating film are formed so that the second gate insulating film is thicker than the first gate insulating film.

13. The method of manufacturing the semiconductor device according to claim 12, wherein the step of (g) is performed after the step of (d) and prior to the step of (e).

14. The method of manufacturing the semiconductor device according to claim 13 further comprising the step for forming the FINFET of, after the step of (a) and prior to the step of (b):

(j) forming a second semiconductor layer made of the monocrystalline silicon so as to cover the first semiconductor layer, wherein in the step of (b), the second semiconductor layer is arranged so as to cover a top portion of the first semiconductor layer having the fin shape by processing the second semiconductor layer together with the first semiconductor layer, in the step of (c), the channel layer is formed so as to cover also the second semiconductor layer on the top portion of the first semiconductor layer having the fin shape, and in the thickness of the channel layer having the arch shape, the crosspiece portion is thicker than the sidewall portion by arranging the second semiconductor layer.

15. The method of manufacturing the semiconductor device according to claim 14, wherein, in the step of (a), the semiconductor substrate having the first semiconductor layer as a top layer in which an insulating layer is arranged on a bottom layer of the first semiconductor layer is prepared, and the FINFET is formed on the insulating layer in the semiconductor substrate.

* * * * *